(12) United States Patent
Lin et al.

(10) Patent No.: US 7,800,391 B2
(45) Date of Patent: Sep. 21, 2010

(54) APPARATUS FOR TESTING A CHIP AND METHODS OF MAKING AND USING THE SAME

(75) Inventors: Tai-Hung Lin, Pingtung Hsien (TW); Chih-Ming Chiang, Hsinchu Hsien (TW); Yi-Hsien Lee, Sinjhuang (TW); Chi-Ming Lee, Hsinchu (TW)

(73) Assignee: MediaTek Inc. (TW)

( * ) Notice: Subject to any disclaimer, the term of this patent is extended or adjusted under 35 U.S.C. 154(b) by 734 days.

(21) Appl. No.: 11/474,108

(22) Filed: Jun. 23, 2006

(65) Prior Publication Data

US 2007/0164771 A1 Jul. 19, 2007

Related U.S. Application Data

(60) Provisional application No. 60/755,137, filed on Dec. 30, 2005.

(51) Int. Cl.
*G01R 31/26* (2006.01)
(52) U.S. Cl. .................................... 324/765; 324/158.1
(58) Field of Classification Search ........................ None
See application file for complete search history.

(56) References Cited

U.S. PATENT DOCUMENTS

| | | | | |
|---|---|---|---|---|
| 5,808,474 A | * | 9/1998 | Hively et al. | 324/755 |
| 6,559,665 B1 | * | 5/2003 | Barabi | 324/755 |
| 6,873,927 B2 | * | 3/2005 | Chi et al. | 702/117 |
| 6,914,424 B2 | * | 7/2005 | Chi et al. | 324/158.1 |
| 7,053,496 B2 | * | 5/2006 | Stone | 257/798 |
| 2004/0004490 A1 | | 1/2004 | Huang | |

FOREIGN PATENT DOCUMENTS

| DE | 10318394 A1 | | 2/2004 |
|---|---|---|---|
| GB | 2392251 | * | 9/2005 |
| GB | 2392251 B | | 9/2005 |

OTHER PUBLICATIONS

German Office Action dated Jun. 30, 2009; German Patent Application File No. 10 2006 045 081.7-35; German Patent and Trademark Office, Munich, Germany.

* cited by examiner

*Primary Examiner*—Vinh P Nguyen
(74) *Attorney, Agent, or Firm*—The Law Offices of Andrew D. Fortney; Andrew D. Fortney

(57) ABSTRACT

An apparatus and method for testing an integrated circuit in a target electronic application, wherein the apparatus includes a socket for receiving the integrated circuit, a modified commercial electronic product which models the target electronic application, and an electrical connection between the socket and the modified commercial electronic product. The method of testing an integrated circuit includes placing an integrated circuit in a socket that is coupled to a circuit board substantially identical to that of a circuit board configured to include the integrated circuit, but which does not include the integrated circuit, and testing the integrated circuit. A method of making such a tester mechanically attaching a socket to a modified commercial electronic product and electrically connecting an integrated circuit and the modified commercial electronic product. This approach allows for cheaper, more comprehensive, and more accurate testing of an integrated circuit.

35 Claims, 21 Drawing Sheets

RELATED ART

APPARATUS FOR TESTING A CHIP AND METHODS OF MAKING AND USING THE SAME

RELATED APPLICATIONS

This application claims priority to and the benefit of U.S. Provisional Application No. 60/755,137 filed on Dec. 30, 2005, which is herein incorporated by reference.

FIELD OF THE INVENTION

The present invention generally relates to the field of integrated circuits. More specifically, embodiments of the present invention pertain to apparatuses and methods for testing an integrated circuit in which the apparatus may comprise a socket, a modified commercial electronic product and an electrical connection between the socket and the modified commercial electronic product.

DISCUSSION OF THE BACKGROUND

Integrated circuits (IC's) are used in a wide variety of commercial electronic products, such as mobile phones, personal digital assistant (PDA's), digital cases, etc. Generally, an IC designed to implement a specific purpose within an electronic device. For example, a mobile phone may comprise an IC for power management, an IC for RF processing, and an IC for multimedia applications. However, an IC designed to implement a specific purpose may contain numerous functions depending on the commercial electronic product in which it is be included. Some mobile phones have peripheral components such as image sensors, MP3 encoders, and LCD displays. In addition there may be different versions or types of peripheral components (e.g., the image sensor may comprise CCD technology or CMOS technology, or there may be different hardware versions or manufacturers of an LCD display). Accordingly, a single IC may need to be compatible with a multitude of different types and versions peripheral components.

In addition to the numerous environments in which a given IC may operate, there are other considerations when manufacturing a commercial electronic product. An IC may contain tens to hundreds of millions of electronic components, such as transistors and capacitors, on a semiconductor substrate. Furthermore, thousands of dies (unpackaged integrated circuits) may be included on a signal semiconductor wafer during the fabrication process. Processing of a wafer is complex, and may consist of numerous steps such as imaging, depositing, doping, etching, planarizing, and cleaning. After wafer processing is completed, the wafer is cut into individual dies, packages, and wired, resulting in the creation of up to tens of thousands of integrated circuits ready to be included in a commercial product. The process of creating an IC is not faultless: many of the dies and/or packaged IC's may contain defects or errors.

In many commercial electronic products, an IC is foxed to a printed circuit board (PCB) along with other electrical, mechanical, or electro-mechanical components. Some integrated circuits are more expensive than the other components. Because the process of fixing the other components to a PCB may cause damage to some temperature sensitive integrated circuits, manufacturers may fix sensitive integrated circuits to the PCB in one of the last manufacturing stages. However, if a defective IC is fixed on a PCB, other components or peripheral devices may be damaged when power is applied. This may render the other components fixed on the PCB, the peripheral components attached to the PCB, or even the PCB itself, valueless. Even if a defective IC does not damage other components or peripheral devices, manufacturing and engineering time and money will be spent testing and repairing the PCB if the IC is defective. Thus, it is desirable to have adequate assurances that any given IC is not defective before it is fixed to a PCB.

There are numerous conventional methods for testing an IC. The wafer may be tested in-between the various processing steps to ensure that it has not been damaged by a previous processing step. Additionally, fabrication houses may perform device testing on the individual dies after wafer processing has been completed. This is to ensure that some of the many devices in the die perform properly. Typically, the cost of this service is charged to the customer. Fabrication houses calculate the percentage of good dies to total dies fabricated in any given fabrication run (the "yield"). Many fabrication houses may also test the die after packaging to ensure that it was not damaged during packaging and to validate the wire bonding process. This service may also be charged to the customer. However, given the number of devices on a typical IC and the numerous environments in which a given IC must operate, the conventional testing processes may be both inadequate and cost prohibitive.

Therefore, a need exists for an apparatus and method to test an integrated circuit that is cost effective and fully exercises substantially all predefined functions of the integrated circuit.

SUMMARY OF THE INVENTION

Embodiments of the present invention relate to apparatuses and methods for testing an integrated circuit. The apparatus is generally designed to mimic the operating environment of a target electronic application in which the IC is to be used. By such an approach, the environment for testing an integrated circuit will also mimic the target electronic applications.

In one aspect, the invention concerns the apparatus for testing an integrated circuit, comprising: a socket, configured to receive the integrated circuit; a modified commercial electronic product comprising a circuit board substantially identical to that of a commercial electronic product configured to include the integrated circuit, wherein the modified commercial electronic product does not include the integrated circuit; and a plurality of conductors electrically connecting at least one electrical contact of the integrated circuit and at least one electrical contact of the modified commercial electronic product.

In another aspect, the invention concerns an apparatus for testing an integrated circuit, comprising: a power source; a switch; a tester comprising a socket configured to receive the integrated circuit, a circuit board substantially identical to that of a commercial electronic product configured to include the integrated circuit, a plurality of conductors electrically connecting at least one electrical contact of the integrated circuit and at least one electrical contact of the circuit board; and a circuit configured to detect (i) whether the integrated circuit is properly aligned in the socket and/or (ii) the voltage at and/or current through one or more predetermined terminals of the tester.

In yet another aspect, the invention concerns a method of testing an integrated circuit, comprising: placing the integrated circuit in a socket which is mechanically coupled to a modified commercial electronic product, the modified commercial electronic product comprising a circuit board substantially identical to that of a commercial electronic product configured to include the integrated circuit, but which does not include the integrated circuit; and testing the integrated circuit.

In another aspect, the invention concerns a method of making an integrated circuit tester, comprising: mechanically attaching a socket to a modified commercial electronic product, the modified commercial electronic product comprising a circuit board substantially identical to that of a commercial electronic product configured to include the integrated circuit, but which does not include the integrated circuit; and configuring a plurality of conductors to electrically connect at least one electrical contact of the integrated circuit and at least one electrical contact of the modified commercial electronic product when the integrated circuit is in the socket.

The present invention advantageously provides an economically and commercially viable approach to testing an integrated circuit. The approach diminishes the need for extensive and costly device testing at the fabrication house and further provides a more comprehensive testing environment for testing IC's after packaging. Test accuracy can be improved because the IC's can be tested in an actual target application. Further, the present invention advantageously provides a novel implementation of an apparatus for testing an integrated circuit. These and other advantages of the present invention will become readily apparent from the detailed description of preferred embodiments below.

DETAILED DESCRIPTION OF THE PREFERRED EMBODIMENTS

Figure 1:
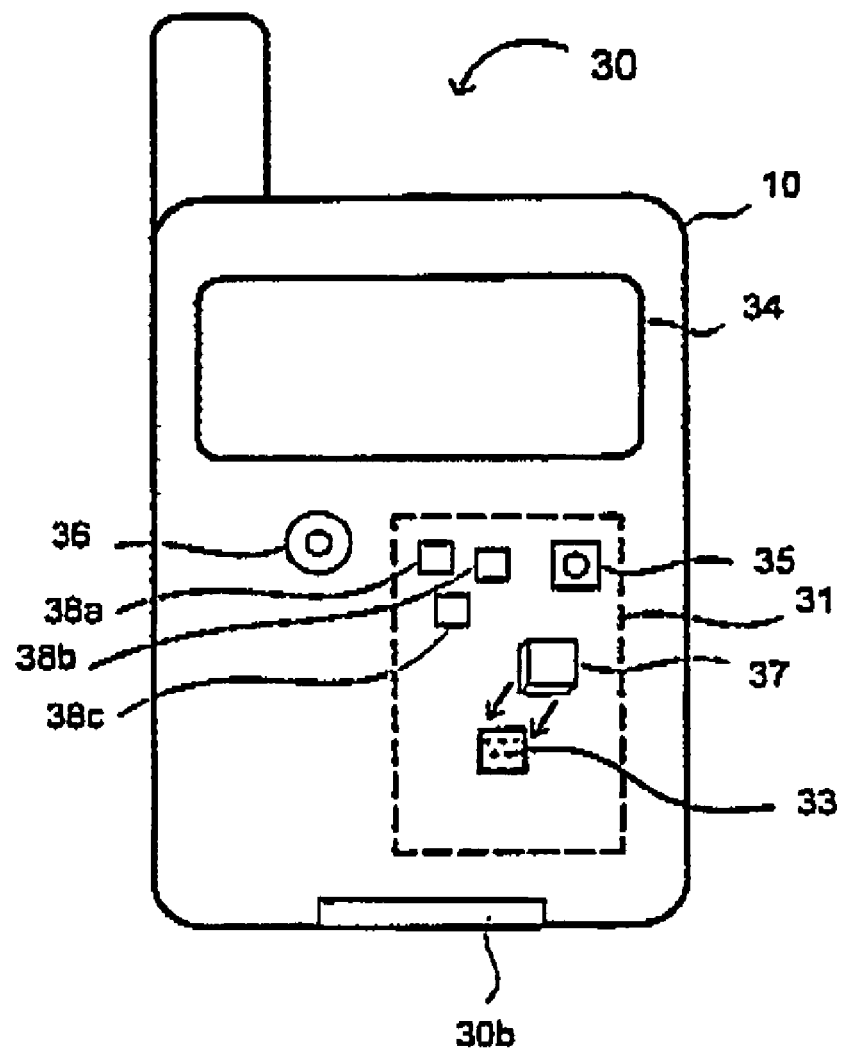
FIG. 1 is a diagram showing the top view of a commercial electronic product.

Reference will not be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover the alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not the unnecessarily obscure aspects of the present invention.

For convenience and simplicity, the terms "conductor(s)", "wires(s)", "pin(s)", "trace(s)", "line(s)", "bus" or bus(ses)", "plane(s)", "via(s)", "plug(s)", "contact(s)", "pad(s)", "electrical contact(s)", "contact(s)", "lead(s)", and "thru-hole(s)" may be used interchangeably, as may the terms "support(s)", "holder(s)", "structure(s)", "stage(s)" and "fixture(s)", but these terms are also generally given their art-recognized meaning. Also, for convenience and simplicity, the terms "circuit board(s)" and "printed circuit board(s)" may be used interchangeably, and generally refer to a device for electrically connecting one or more electronic devices, components, and/or conductors. The terms "electronic product(s)" and "commercial electronic product(s)" may also be used interchangeably. The terms "socket(s)", "test socket(s)", "holder(s)" and "fixture(s)" may further be used interchangeably for convenience and simplicity, and generally refer to an apparatus in which an integrated circuit chip is placed and held. Such apparatuses (and particularly a socket and or test socket) may have a plurality of electrical connections placed in substantial alignment with input and/or output pins on an integrated circuit. However, these terms are also given the prior art-recognized meanings.

The present invention concerns apparatuses and methods for testing an integrated circuit. An apparatus may comprise a socket, a modified commercial electronic product, and an electrical connection between the socket and the modified commercial electronic product. In one aspect, the invention concerns an apparatus for testing an integrated circuit, comprising: a socket configured to receive the integrated circuit; a modified commercial electronic product comprising a circuit board substantially identical to that of a commercial electronic product configured to include the integrated circuit, wherein the modified commercial electronic product does not include the integrated circuit; and a plurality of conductor electrically connecting at least one electrical contact of the integrated circuit and at least one electrical contact of the modified commercial electronic product.

In another aspect, the invention concerns an apparatus for testing an integrated circuit, comprising: a power source, a switch; a tester comprising a socket configured to receive the integrated circuit, a circuit board substantially identical to that of a commercial electronic product configured to include the integrated circuit, a plurality of conductors electrically connecting at least one electrical contact of the integrated circuit and at least one electrical contact of the circuit board; and a circuit configured to detect (i) whether the integrated circuit is properly aligned in the socket and/or (ii) the voltage at and/or current through one or more predetermined terminals of the tester.

In yet another aspect, the invention concerns a method of testing an integrated circuit, comprising: placing an integrated circuit in a socket which is mechanically coupled to a modified commercial electronic product, the modified commercial electronic product comprising a circuit board substantially identical to that of a commercial electronic product configured to include the integrated circuit, but which does not include the integrated circuit; and testing the integrated circuit.

In another aspect, the invention concerns a method of making an integrated circuit tester, comprising: mechanically attaching a socket to a modified commercial electronic product, the modified commercial electronic product comprising a circuit board substantially identical to that of a commercial electronic product configured to include the integrated circuit, but which does not include the integrated circuit; and configuring a plurality of conductors to electrically connect at least one electrical contact of the integrated circuit and at least one electrical contact of the modified commercial electronic product when the integrated circuit is in the socket.

The invention, in its various aspects, will be explained in greater detail below with regard to exemplary embodiments.

An Exemplary Apparatus for Testing an Integrated Circuit

In one embodiment, an exemplary apparatus for testing an integrated circuit includes: a socket configured to receive the integrated circuit; a modified commercial electronic product comprising a circuit board substantially identical to that of a commercial electronic product configured to include the integrated circuit wherein the modified commercial electronic product does not include the integrated circuit; and a plurality of conductors electrically connecting at least one electrical contact of the integrated circuit and at least one electrical contact of the modified commercial electronic product.

A commercial electronic product may contain several electrical, mechanical, or electro-mechanical components necessary to perform one or more predefined functions. For example, FIG. 1 shows a commercial electronic product 30 which includes mechanical housing 10. The commercial electronic product 30 may include peripheral components such as an LCD screen 34, an image sensor 36, and/or a speaker (not shown) as well as one or more input/output ports for sending and/or receiving information, such as port 30b. In addition, the commercial electronic product 30 may contain a circuit board 31 which is generally enclosed in the mechanical housing 10. The circuit board 31 may electrically connect to the peripheral components and may further contain additional electrical, mechanical, or electro-mechanical components. For example, circuit board 31 may be configured with electrical contacts 33 for attaching an electronic component 37. The electronic 37 may be an active device, a passive device, or a combination thereof. The electronic component 37 may further be packaged or unpackaged and may also be multi-chip module or some other electronic device with a connector. For purposes of this discussion, the electronic component to be tested, electronic component 37, is a packaged integrated chip. However, one skilled in the art can appreciate the need to test the types of electronic components and can further adapt the description of the invention to include such devices. The circuit board 31 may contain numerous electronic components 38a, 38b, 38c in addition to integrated circuit 37 which are necessary to implement a predetermined function of the commercial product. The circuit board may also contain one or more input/output ports, such as port 35 for sending and/or receiving information As shown, ports 30b and 35 contain electrical contacts to which a cable or other conductors may be attached. However, ports 30b and 35 may also be functional ports, such as ports which send and/or receive information without requiring the attachment of wires (e.g., infrared or radio frequency ports).

Figure 2:
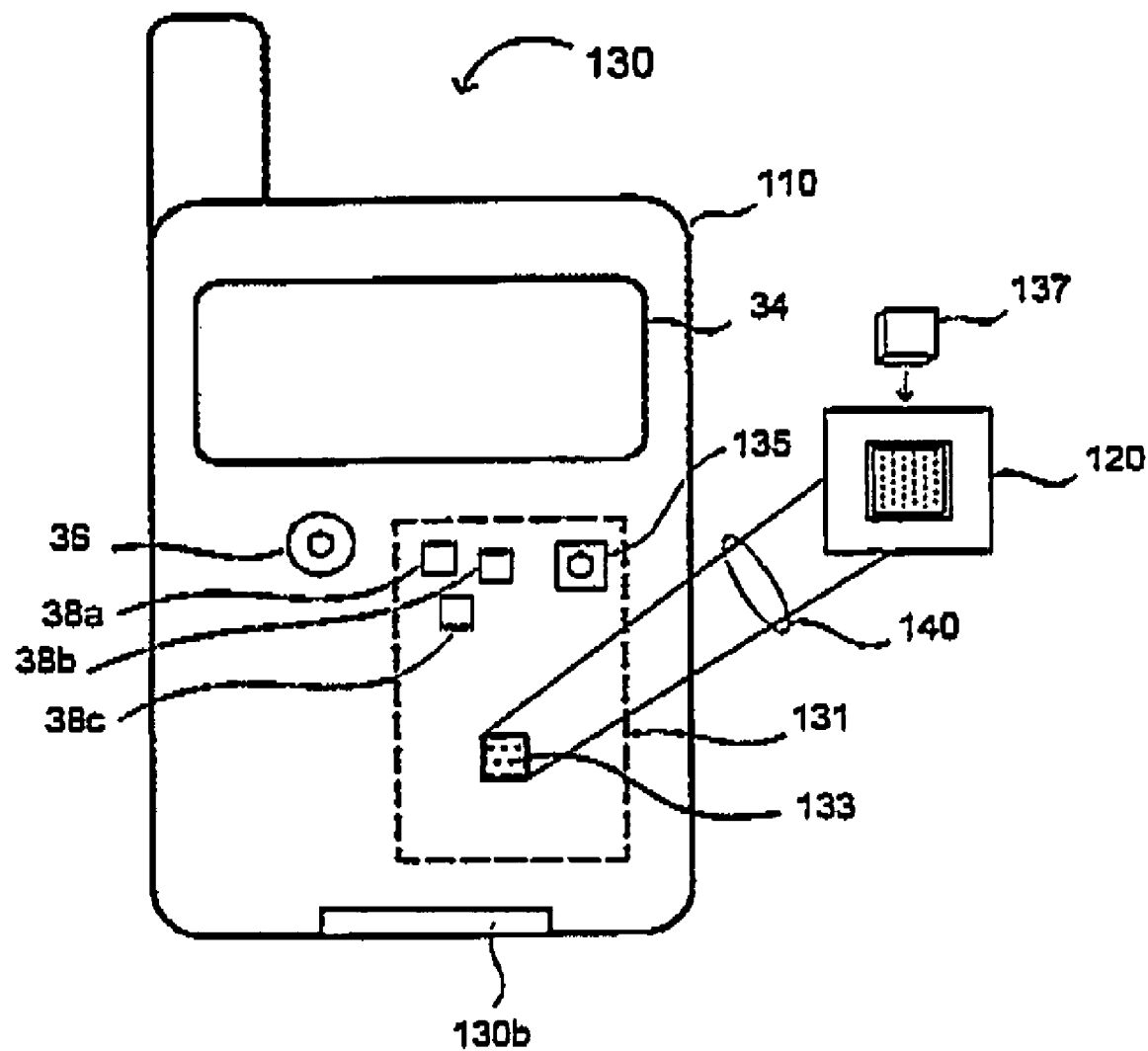
FIG. 2 is a diagram showing an exemplary apparatus for testing an integrated circuit according to the present invention.

The present invention concerns an apparatus and method to test an integrated circuit for use in a commercial electronic product that is cost effective and that can fully exercise the integrated circuit in its target electronic application. One embodiment of the present invention is shown in FIG. 2. A modified commercial electronic product 130 may contain a circuit board 131 containing numerous electronic components 38a, 38b, 38c and input/output port 135. While the circuit board 131 contains electrical contacts 133 for attaching the device under test (an integrated circuit), IC 137 is not attached to the circuit board 131. Rather, integrated circuit 137 is placed in a socket 120 that is, in turn, electrically connected to substantially the same electrical contacts on the PCB 131 that the integrated circuit 137 would be. Thus, the modified commercial electronic product 130 contains a circuit board 131 which is substantially identical to that of the commercial electronic product of FIG. 1; however, it does not contain the integrated circuit 137. As will be seen herein, a number of modifications can be made to circuit board 131 within the scope of this invention. A plurality of conductors 140 electrically connect one or more (generally, a plurality of) electrical contacts 133 of the modified commercial electronic product 130 to one or more (generally, a plurality of) electrical contacts (not shown) of the integrated circuit 137. In this fashion, the integrated circuit may be tested in an environment similar to that which it will be finally included. This provides a more complete environment in which to test an integrated circuit and provide a greater degree of certainty that the test results will reflect the true outcome of placing the tested IC in the predetermined location on the circuit board. It may also be cheaper than extensive device testing at a fabrication house.

A circuit board in which multiple electronic devices (e.g., integrated circuits) are attached may contain multiple electrical contacts. Electronic devices are generally contained within a package and may also contain multiple electrical contacts for electrically communicating to external devices. Generally, electronic devices are fixed to a circuit board by soldering the electrical contacts of the electronic device to electrical contacts of the circuit board. One aspect of the present invention includes a socket configured to receive an electronic device (such as an integrated circuit), a circuit board containing pads (such as electrical contacts) corresponding to the electrical contacts of the electronic device, and a plurality of conductors to electrically connect the electrical contacts of the electronic device and the pads of the circuit board. In one example, the integrated circuit contains electrical leads and the circuit board contains electrical pads corresponding to the electrical leads of the integrated circuit. The plurality of conductors may electrically connect one or more electrical leads to one or more electrical pads. Each conductor of the plurality of conductors may include a copper wire attached to a circuit board contact on one end and a terminal on the other. The terminal may be held by the socket to physically and electrically contact an electrical contact of the electrical device. In another example, one of the plurality of conductors may comprise a pin, physically placed in and soldered to a thru-hole of a circuit board on one end and physically and electrically connected to an adapter on the other, wherein the adapter is further configured to be electrically connected to a terminal. Accordingly, any one or all of the plurality of conductors of the present invention may comprise multiple conductive parts (i.e., pin, wire, adapter, and/or terminal). Further, a conductive part of one or more of the plurality of conductors may further comprise a copper wire, an enamel-coated wire, a conductor in a multiple conductor cable, traces and or other conductive film embedded within or on a printed circuit board, and the like. Constructing single conductor comprising multiple parts is well known in the art.

In one implementation, the modified commercial electronic product 130 comprises substantially all electrical, mechanical, and/or electro-mechanical components that, when couple to the integrated circuit 137, perform a predefined function of the commercial electronic product. The modified commercial electronic product 130 may contain peripheral components such as an LCD screen 34, an image sensor 36, and/or a speaker (not shown). The modified commercial electronic products 130 may also contain an input/output port 130b. The testing environment more accurately reflects the actual operating environment of the integrated circuit when a greater number of peripheral components are included in the modified commercial electronic product.

Figure 3A:
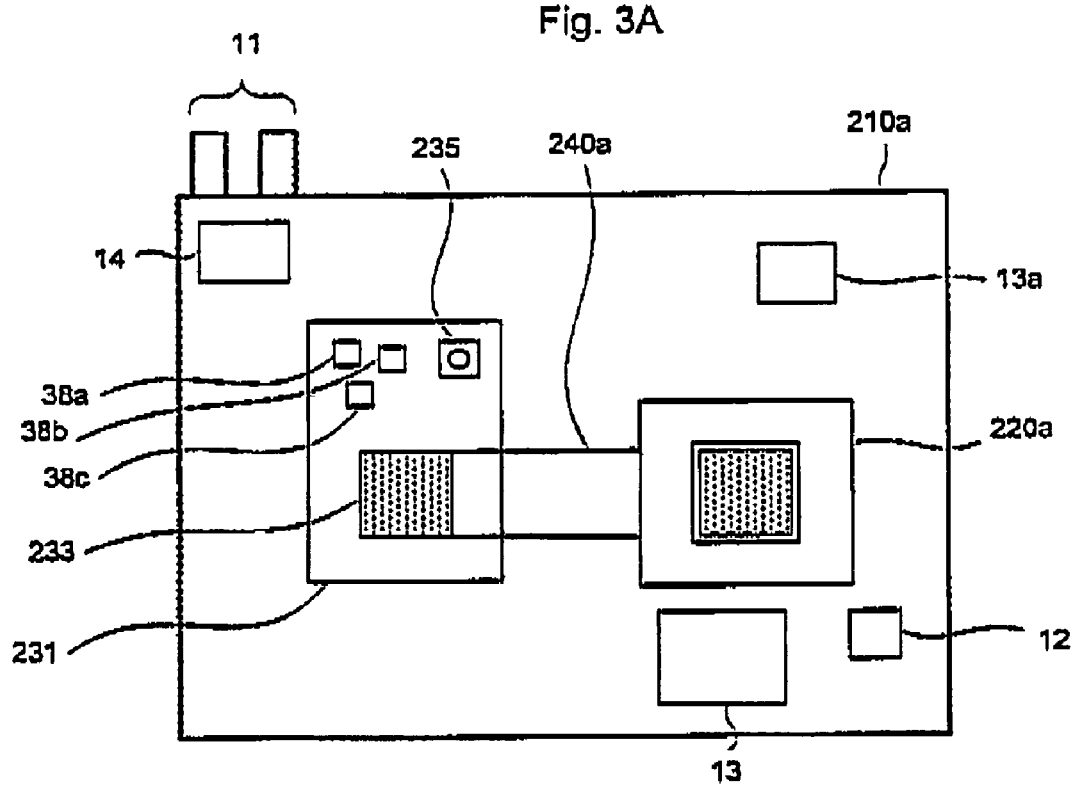
FIGS. 3A and 3B are diagrams showing other apparatus for testing an integrated circuit according to the present invention.
Figure 3B:
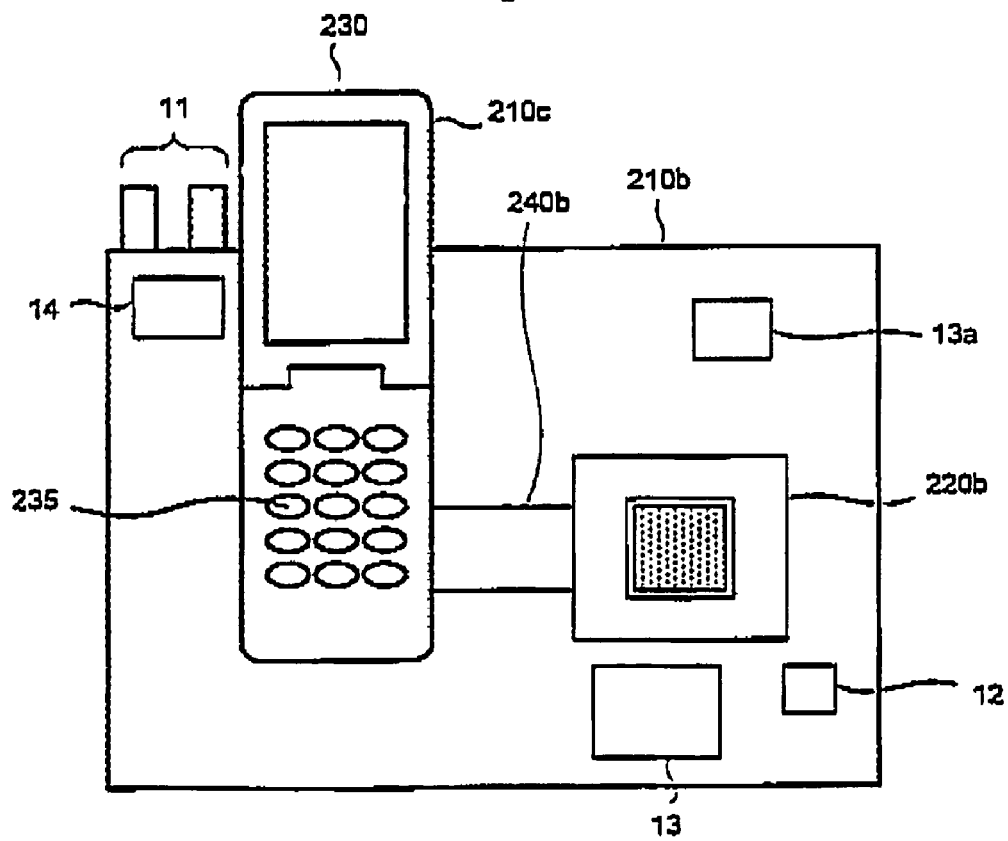

In another implementation, the testing apparatus further includes a mechanical housing containing or supporting the circuit board. As shown in FIG. 2, circuit board 131 is contained in a mechanical housing 110. The mechanical housing 110 may also provide mechanical support to the modified commercial electronic product 130 and peripheral components, such as an LCD screen 34 and an image sensor 36. Another exemplary mechanical housing is shown in FIG. 3A where the circuit board 231 is supported by mechanical housing 201a. The mechanical housing 210a may also support socket 200a and/or conductors 240a. In another example, the mechanical housing in FIG. 3B includes mechanical housing 210b which supports mechanical housing 210c containing a circuit board (not shown). Likewise, the mechanical housing 210b may also support socket 220b and/or conductors 240b. In addition, mechanical housing 210a and 210b as shown in FIGS. 3A and 3B may include other components, such a port 11, switch 12, indicator 13, power supply 14, and/or other component 13a, each of whose functions will become apparent below.

Figure 4:
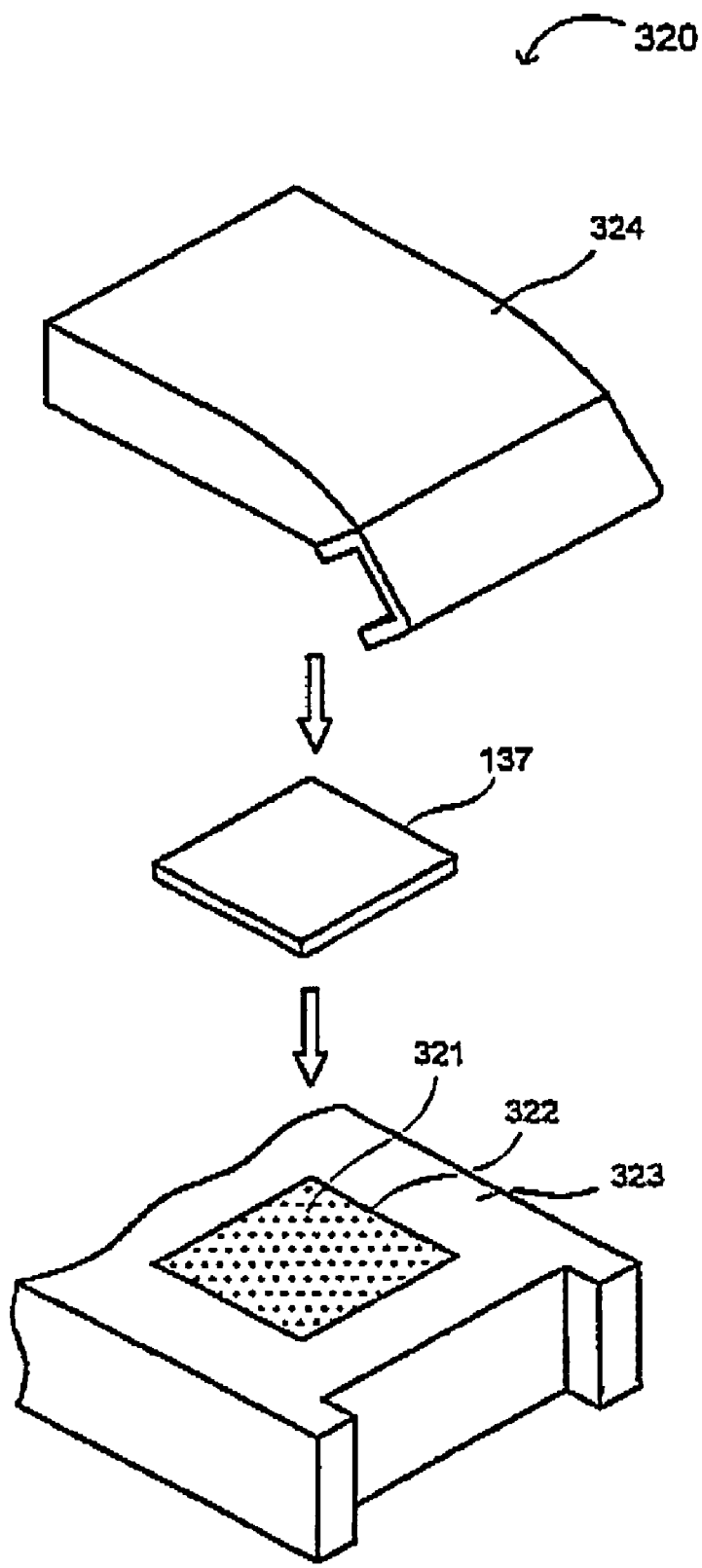
FIG. 4 is a diagram showing a single-chip socket of the present invention.

As stated above, the integrated circuit to be tested is placed in a socket. Referring now to FIG. 4, a socket 320 is shown. In one implementation, socket 320 includes a seat 322 which is configured to hold and align the integrated circuit 137 and a base 323 which provides mechanical support for the seat 322. Seat 322 may be a recessed portion of the base 323 such that the seat 322 is lower than a top side of the base 323. Note that "lower", "higher", "upper", "top", "bottom", "up", "down", "side" and other such terms are relative, and for illustrative purposes. The seat may also be formed by protruding, from the base 323, a mechanical structure with internal dimensions of that about equal to that of that of the external dimensions of the integrated circuit 137. In this case, the protrusion would be "higher" than both the seat 322 and the base 323 which may be at about the same height.

In another implementation, the socket 320 may also include terminal supports 321 which correspond to electrical contacts of the integrated circuit 137 such that when an integrated circuit 137 is placed in the seat 322, terminals within the terminal supports 321 contact the electrical contacts of the integrated circuit 137. The terminals may be part of the plurality of conductors 140, as shown in FIG. 2, which electrically connect at least one electrical contact of the integrated circuit 137 and at least one electrical contact 133 of the modified commercial electronic application 130. The plurality of conductors 140 may be enamel-coated or copper wires, conductive pins, a cable comprising multiple conductor, and/or a combination thereof. In one example, enamel-coated or copper wires 140 may be soldered on one end to electrical contacts 133 and on the other end to conductive terminals placed in terminal supports of socket 120. In another example, a first adapter is soldered to electrical contacts 133, a second adapter is configured to connect to terminals placed in terminal supports of socket 120, and a cable electrically connects the first and second adapters. In yet another example, electrical contacts 133 are thru-holes, and conductive pins connected on one end to the terminals placed in terminal supports of socket 120, are soldered into thru-holes 133.

Referring back to FIG. 4, integrated circuit 137 sits in or on the seat 322. The socket may also include other structures to further secure the integrated circuit in the seat. According to one implementation, socket 320 includes an upper cap 324 configured to expose the seat 322 and secure the integrated circuit 137 in the seat 322. In one example, the upper cap 324 may be mechanically coupled to the base 323 by hinges (not shown). The upper cap 324 may be locked to the base 323 so that the integrated circuit 137 is secured in the seat 322. Additionally, the upper cap 324 may not be locked to the base 323 so that the seat 322 is exposed and the integrated circuit 137 may be placed therein.

Figure 5:
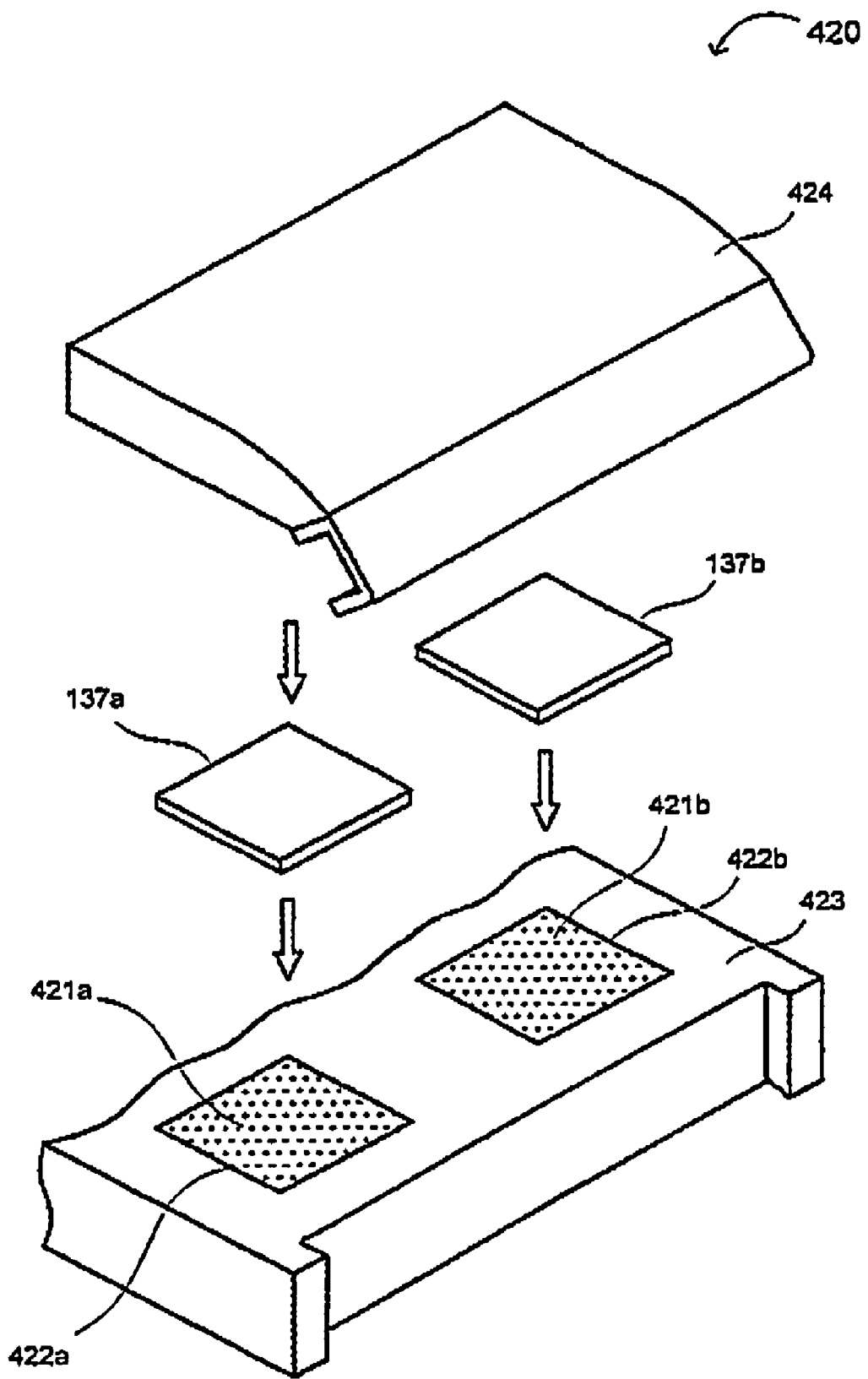
FIG. 5 is a diagram showing a multi-chip socket of the present invention.

In another implementation, the socket may be configured to accept more than one integrated circuit. As shown in FIG. 5, the base 423 may provide mechanical support for seat 422a and seat 422b. Socket 420 may be configured with multiple groups of terminal supports 421a and 421b. Integrated circuit 137a sits in or on seat 422a such that terminals within the terminal supports 421a contact the electrical contacts of integrated circuit 137a. Similarly, integrated circuit 137b sits in or on seat 422b such that terminals within the terminal supports 421b contact the electrical contacts of integrated circuit 137b. As described above, socket 420 may also include an upper cap 424 which may be configured to expose one or more seats 422 a, 422b and secure one or more integrated circuit 137a, 137b therein. In this aspect, it is understood that the upper cap may be a single upper cap, exposing all seats, or may be multiple upper caps, wherein each upper cap exposes one or more seat. While this example shows a simple multi-chip socket, it is understood that the socket may be configured to accept any number of integrated circuits, and the invention is not limited to such a configuration.

Figure 6A:
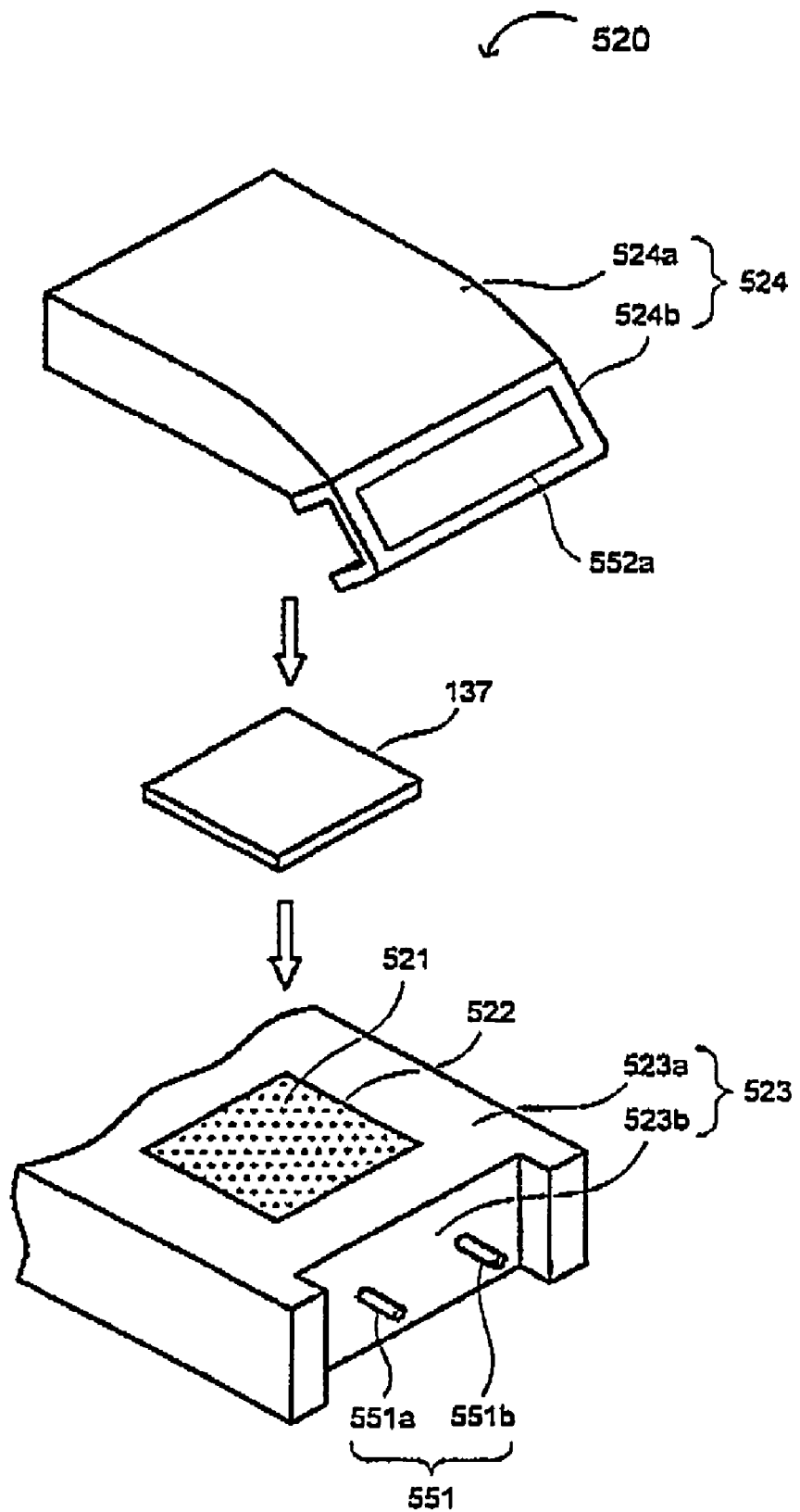
FIGS. 6A, 6B, 6C, and 6D are diagrams showing example detector circuits of the present invention.

In yet another implementation, the socket may include a circuit to detect whether the device under test is properly aligned in the seat. One example of such circuit is shown in FIG. 6A. The base 523 may consist of a top portion 523a and a recessed sidewall portion 523b. The upper cap 524 may consist of a top portion 524a and a moveable side portion 524b such that the moveable side portion 524b can close to lock into the recessed sidewall portion 523b of the base 523. Such a configuration is exemplary, and it should be understood that the base need not have a recessed portion and the upper cap need not have a moveable side portion. This invention is intended to cover any such configuration of the base and the upper cap such that, in one embodiment, a first part of a circuit can be included on the base and a second part of a circuit can be included on the upper cap such that when the upper cap is closed, a closed electrical circuit is formed. In another embodiment, the electrical circuit is closed when the upper cap is closed and the integrated circuit is aligned or seated properly in seat 522. According to one example, two or more electrically conductive terminal 551a, 551b are fixed recess sidewall portion 523b of the base 523. Conductor 552a is configured in or on a moveable side portion 524b of the upper cap 524. When the upper cap is closed and locked to the base, a conducive circuit is formed: one consecutive pin 551a, conductor 552a, and conductive terminal 551b.

Figure 6B:
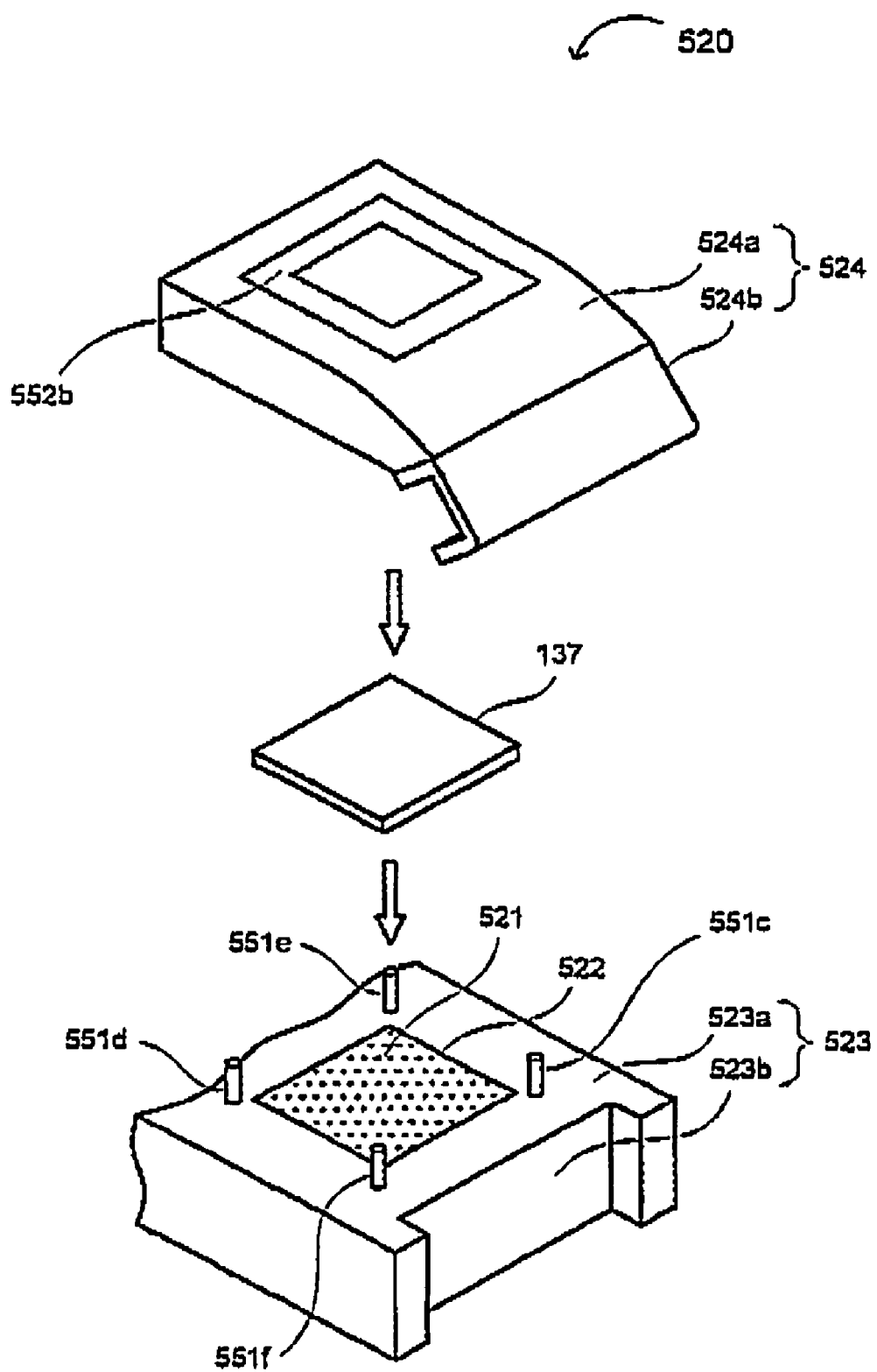
Figure 6C:
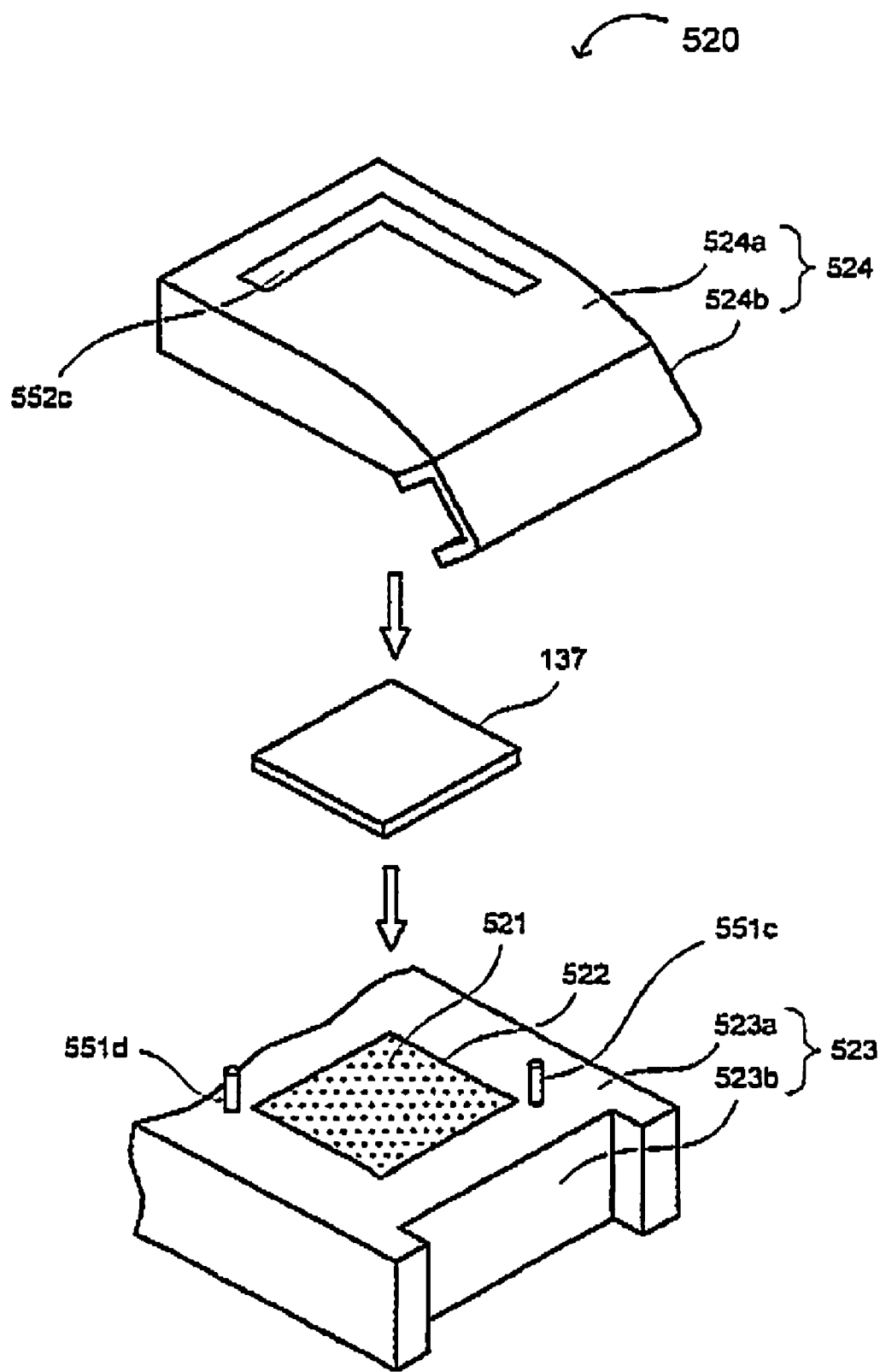

In another example, and as shown in FIG. 6B, conductive terminals 551c, 551d, 551e, 551f may be located on a top portion 523a of the base 523 and conductors 552b may be located on a top portion 524a of the upper cap 524. Or, as shown in FIG. 6C, conductive terminals 551c, 551d may be located on a top portion 523n of the base and conductor 552c may be located on a top portion 524a of the upper cap 524. It is understood that although conductor 552c is shown as single conductor, conductor 552c may comprise multiple conductors, the specific configuration of which corresponds to the placement of the conductive terminals. As such, the conductor 552 can be an "L" shape (as shown in FIG. 6C), a circuit (as shown in FIG. 6B), multiple bars, or any other geometric configuration that enables electrical connection between two or more conductive terminals. Further, one or more conductive terminals 551 may be located on a top portion 523a and on a recessed sidewall portion 523b of the base and one or more conductors 552 may be located on a top portion 524a and a moveable side portions 524b of the upper cap.

Figure 6D:
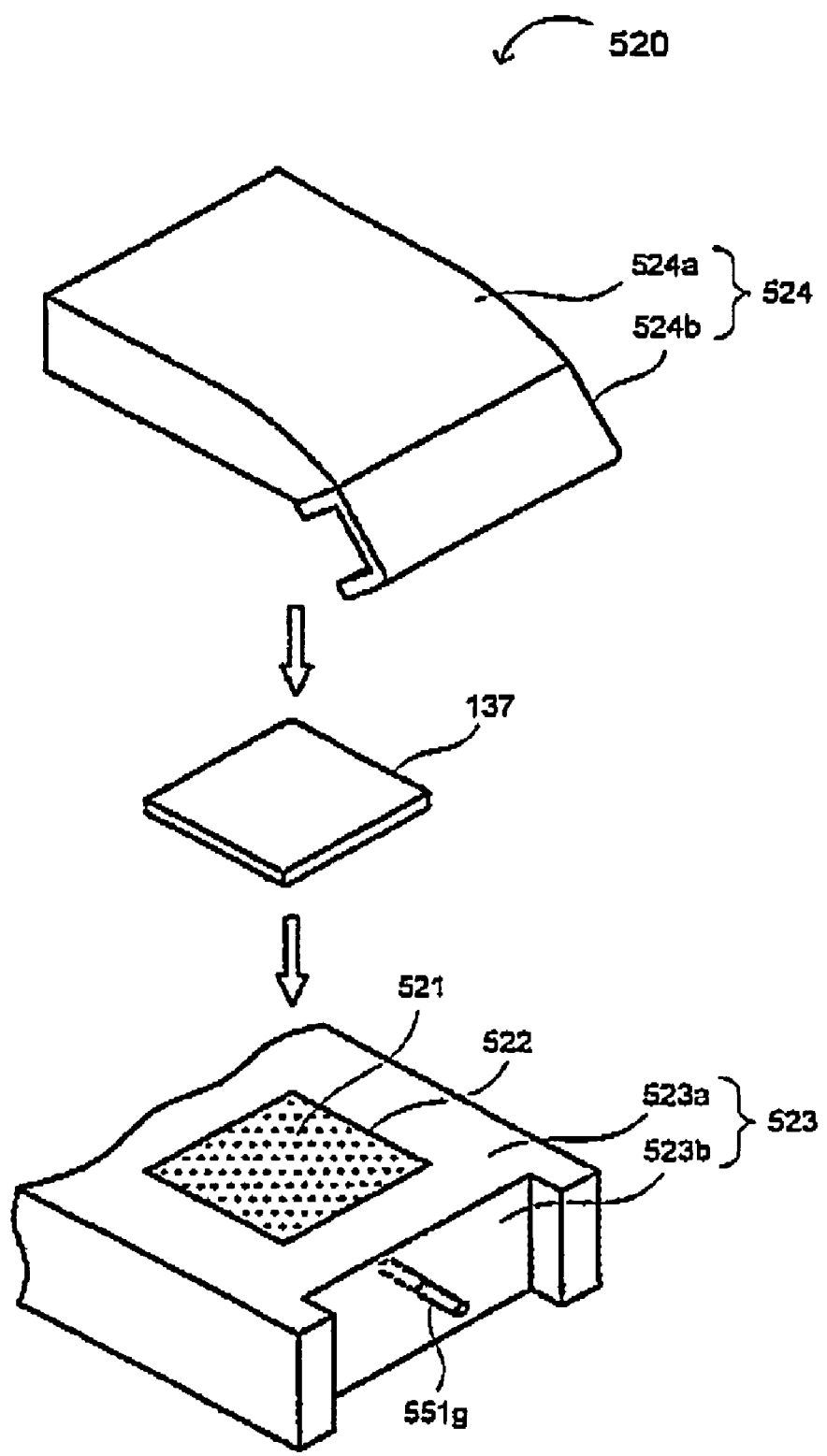

In yet another example of a circuit to detect whether the integrated circuit is properly aligned in the seat, conductive terminals of FIGS. 6A, 6B, and 6C can be replaced by an electro-mechanical switch as shown in FIG. 6D. Switch 551g is configured to open or close (i.e., conduct or not conduct electricity from one terminal of the switch to another) when the upper lid 524 is configured to secure the integrated circuit 137 in the seat 522. As such a conductor is not required on the portion of the socket opposite to the switch (e.g., in the example shown, on the upper cap or on the base). While the example circuit as shown in FIG. 6D contains one switch, it can be appreciated that more than one switch may be included. In accordance with the above description and FIGS. 6A, 6B, 6C, and 6D, one or more switches may be located on a top portion 523a and/or recessed sidewall portion 523b of the base 523. Further, one or more switches may be included on a top portion 524a or a moveable side portion 524b of the upper cap 524, or any combination of the above. In another example, a socket may include two or more conductive terminals and conductors as shown in FIGS. 6A, 6B, and 6C and one or more switches as shown in FIG. 6D on the base and/or the upper cap.

A further implementation of the invention includes an indicator for indicting whether the integrated circuit is properly aligned in the seat. The indicator maybe a visual display, including one or more LCDs or LEDs (e.g., one red LED for indicating a negative result and one green LED for indicating a positive result), or may be an audio indicator, such as a buzzer or speaker. Further, the indicator may be an electrical signal in a circuit, coupled to a controller or processor. In one example, the indicator may be part of or connected to the circuit which detects whether the integrated circuit is properly aligned in the seat.

Figure 7:
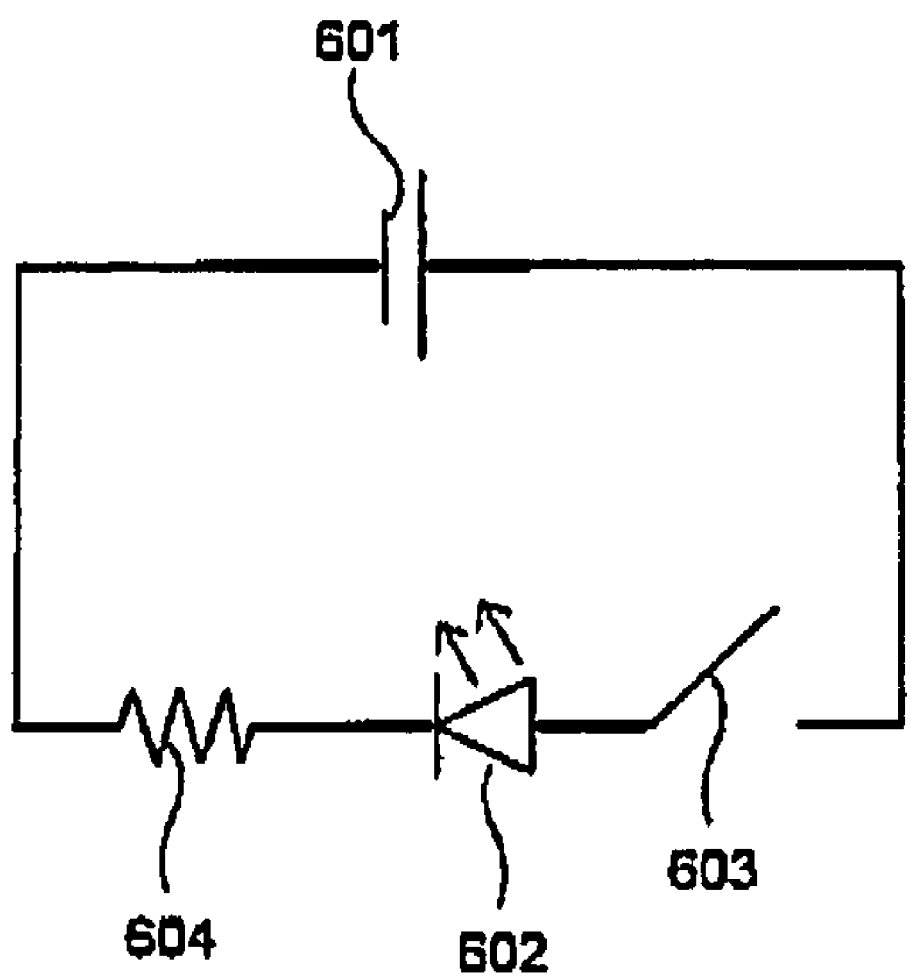
FIG. 7 is a diagram schematically representing a detector circuit of the present invention.

One example of a circuit which detects whether the integrated circuit is properly aligned in the seat is shown in FIG. 7. The detection circuit may include a power source 601 and an indicator 602. The indicator 602 may be an LED as shown, or any other device for indicating. A switch 603 is configured to complete an electrical circuit when an integrated circuit is properly placed in a socket, and may comprise conductive terminals, conductors, and/or electro-mechanical switches as described above. The circuit may also contain other components 604, the configuration of which is known in the art. In one example, the switch is configured closed to provide current to the indicator 602 when the integrated circuit is properly aligned in the seat. It is understood that this is a simple example of a detection circuit, and those skilled in the art can appreciate more complex detection circuits which may include logic and/or other components.

Figure 8:
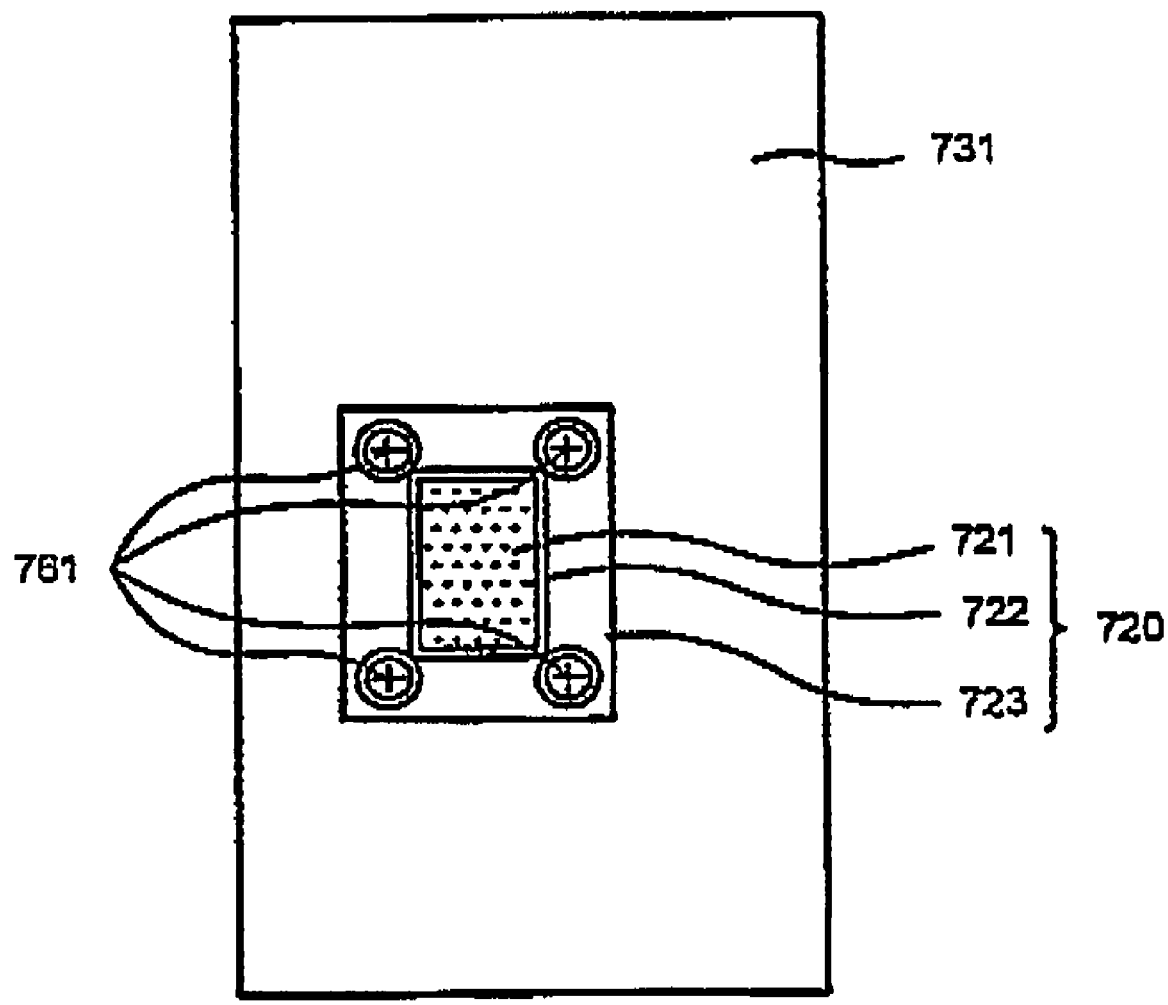
FIG. 8 is a diagram showing a top view of an apparatus of the present invention.

In one implementation, support structures mechanically attach the socket to the modified commercial electronic product. FIG. 8 shows a top view of socket 720 connected to a modified commercial electronic product containing a circuit board. Support structures 761 extend from the base 723 to the circuit board 731. Terminal supports 721 provide mechanical support for terminals at an end of a plurality of conductors. In one example, the base 723 contains holes through which the support structures 761 can pass. In another, support structures 761 are part of the socket 720. However, it is also understood that support structures may be attached to the outside of the base.

Figure 9:
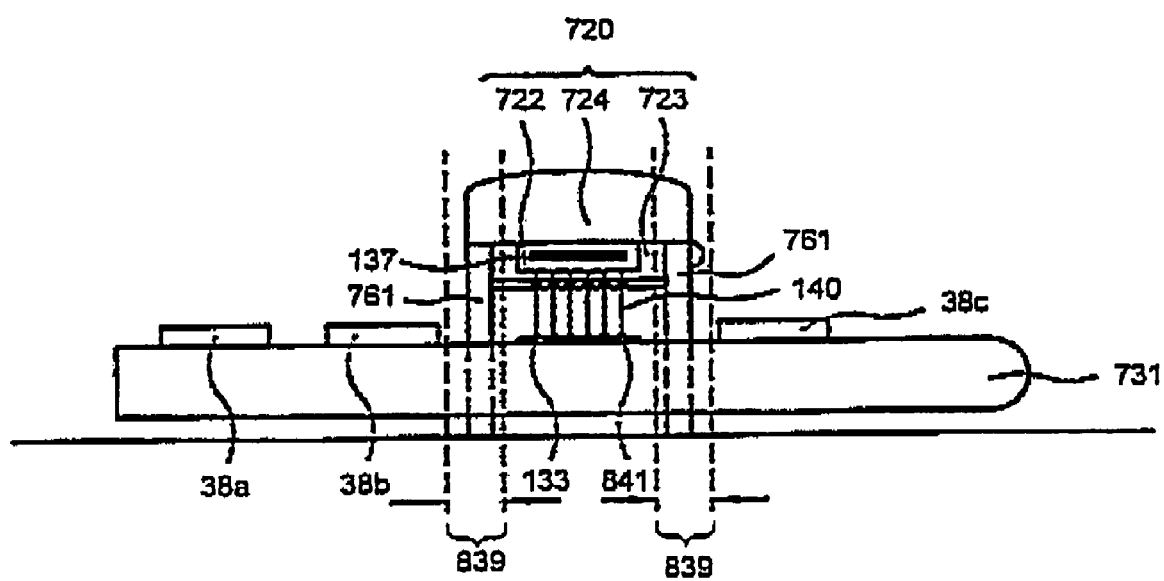
FIG. 9 is a diagram showing a side view of the apparatus of FIG. 8.

FIG. 9 is a diagram showing a side view of a socket and a modified commercial electronic product in accordance with FIG. 8. In this example, the socket is directly fixed to the modified commercial electronic product by support structures attached in an interior area of the circuit board. Circuit board 731 may contain numerous electronic components, such as components 38a, 38b, and 38c. Circuit board 731 also contains electrical contacts 133 corresponding to electrical contacts of the device under test, integrated circuit 137. A socket 720 including terminal supports (not shown), seat 722, a base 723, an upper cap 724 is attached to circuit board 731 by one or more support structures 761. As shown, a plurality of conductors 140 electrically connects at least one electrical contact of the integrated circuit 137 as one electrical contact 133 of the circuit board 731. The plurality of conductors may attach to an adapter 841 on the circuit board 731 and terminals contained in or on the terminal supports (not) shown). The plurality of conductors may be conductive pins, as shown, enamel-coated or copper wires, or any other conductor. The support structures 761 may be attached at the sides of the base 723, as shown, or may be configured to connect to the bottom of the base 723. Further, the support structures may be attached to a top surface of the circuit board, or may pass through holes in the circuit board. Preferably, there is a support structure attachment area 839 that is larger than the support structures 761, where there are no electrical components or conductors. Thus, the support structures 761 may attach to the circuit board in a non-conductive and/or passive way.

However, in other applications, there may not be sufficient support structure attachment area for the support structures to attach or pass through the circuit board in a non-conductive and/or passive way. In even other application, it may not be desirable to modify the component and/or conductor placement of the circuit board (for example, in RF circuits). These applications therefore require the socket to be fixed by support structures which are either attached to an exterior area of the circuit board or not connected to the circuit board at all.

Figure 10A:
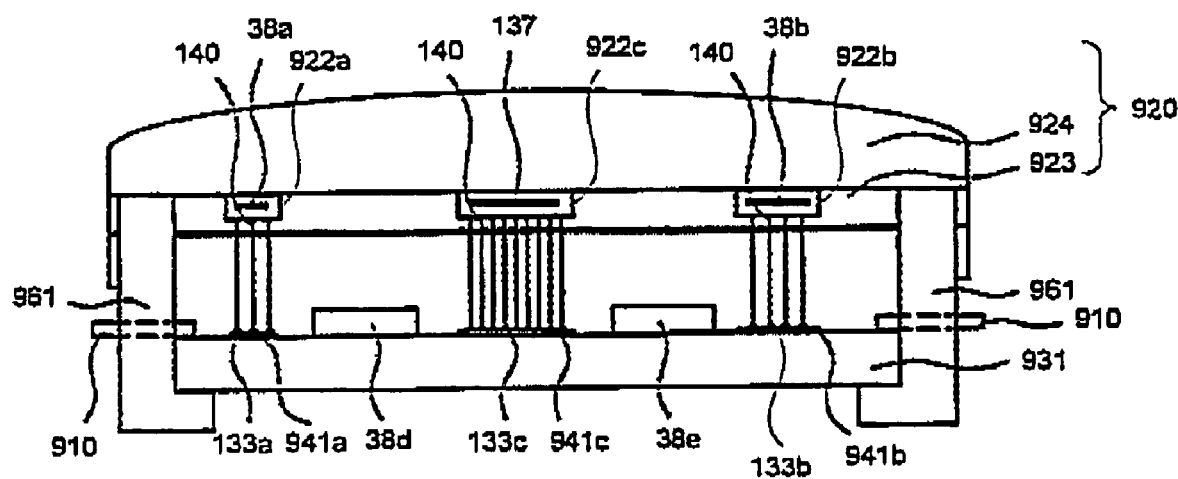
FIGS. 10A and 10B are diagrams showing an alternative embodiment of the present invention.

In one example, the support structures may be attached to the exterior area of a circuit board. As shown in FIG. 10A, circuit board 931 contains electrical components 38d, 38e and electrical contacts 133a, 133b, 133c corresponding to electrical contacts of electrical devices 38a, 38b, and integrated circuit 137, respectively. Socket 920 includes seats 922a, 922b, 922c, base 923, and upper cap 924. While the socket of the present example includes support for multiple seats, the scope of the invention is not limited as such, and the example can include sockets wherein the base provides mechanical support for only one seat. As shown in FIG. 10A, support structures 961 are attached to the socket 920 and further have a mechanism, for securing the circuit board 931. Support structures 961 may contain an extended portion, opposite to the side to which the socket is attached, wherein the circuit board 931 is fixed between a mechanical housing 910 and an extended portion of the support structures 961. A plurality of conductors 140 electrically connects at least one electrical contact of each electrical component 38a, 38b and integrated circuit 137 and at least one electrical contact of the circuit board 133a, 133b, and 133c. The plurality of conductors may attach to an adapter 941a, 941b, 941c and/or terminals contained in the terminal supports (not shown).

Figure 10B:
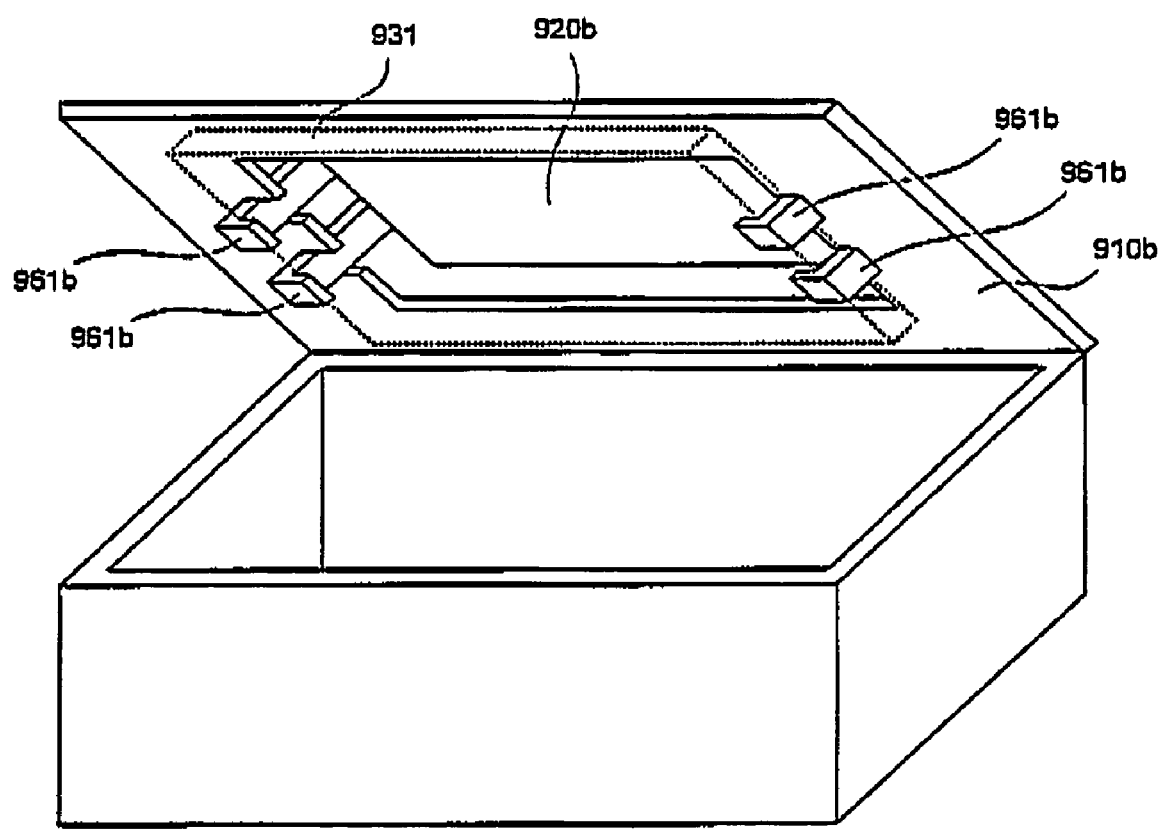

One example of fixing a circuit board between a mechanical housing an extended portion of support structures is shown in FIG. 10B. A mechanical housing 910b may comprise a box with an upper and lower portion. A circuit board, the placement of which is shown by dotted line 931b, is fixed between the upper portion of the mechanical housing 910b and extended portions of support structures 961b. The support structures are further attached to a socket 920b which may be located on another side of the upper portion of the mechanical housing 910b. In this example, it may be necessary to modify the circuit board such that the extended portions of the support structures 961b and the mechanical housing 910b contact the circuit board in a passive and/or non-conductive area. In one example, if the mechanical housing and/or support structures are conductive, a non-conductive film or gasket may be placed on the mechanical housing, support structures and/or the circuit board, such that it is between the circuit board and the mechanical housing and/or support structures.

Figure 11:
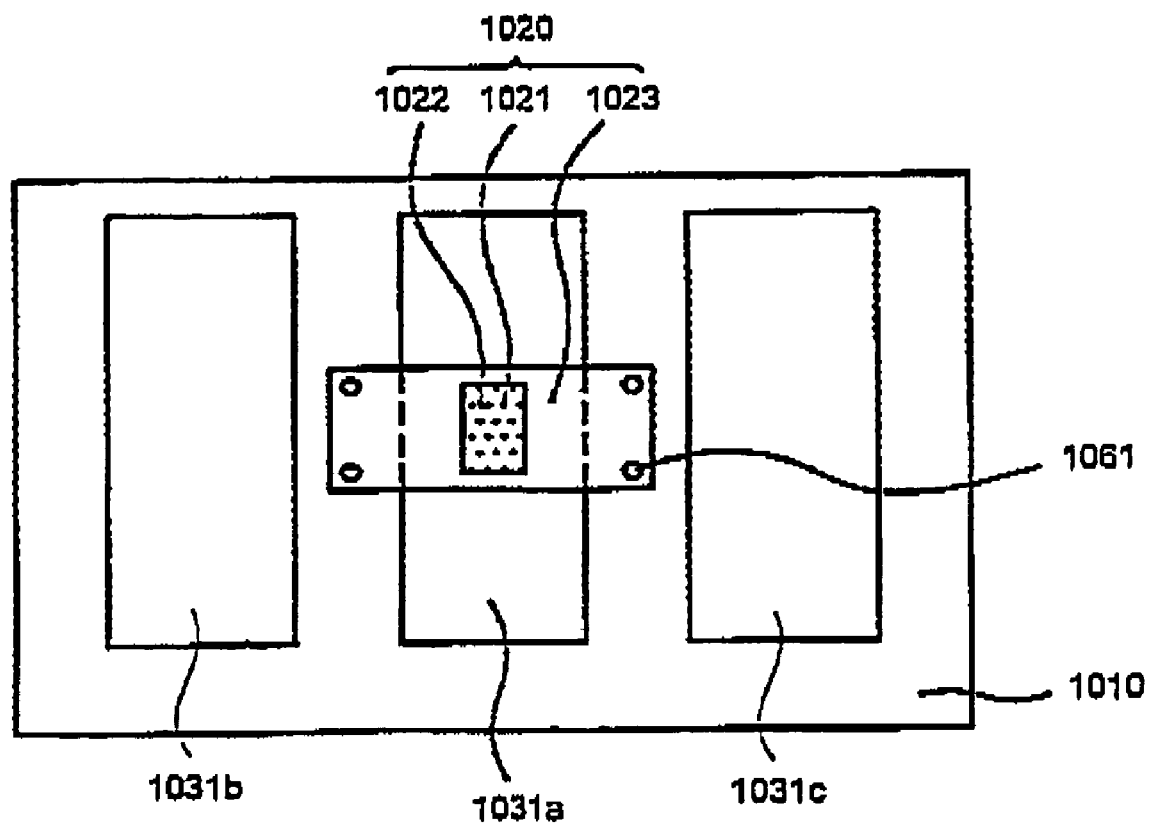
FIG. 11 is a diagram showing top view of yet another apparatus of the present invention.

In another example, the support structures may attach to a mechanical housing containing the circuit board. Referring now to FIG. 11, socket 1020 is attached to a mechanical housing 1010 by support structures 1061. The mechanical housing 1010 further contains or supports the circuit board 1031a may also contain or support additional circuit board 1031b, 1031c.

Figure 12:
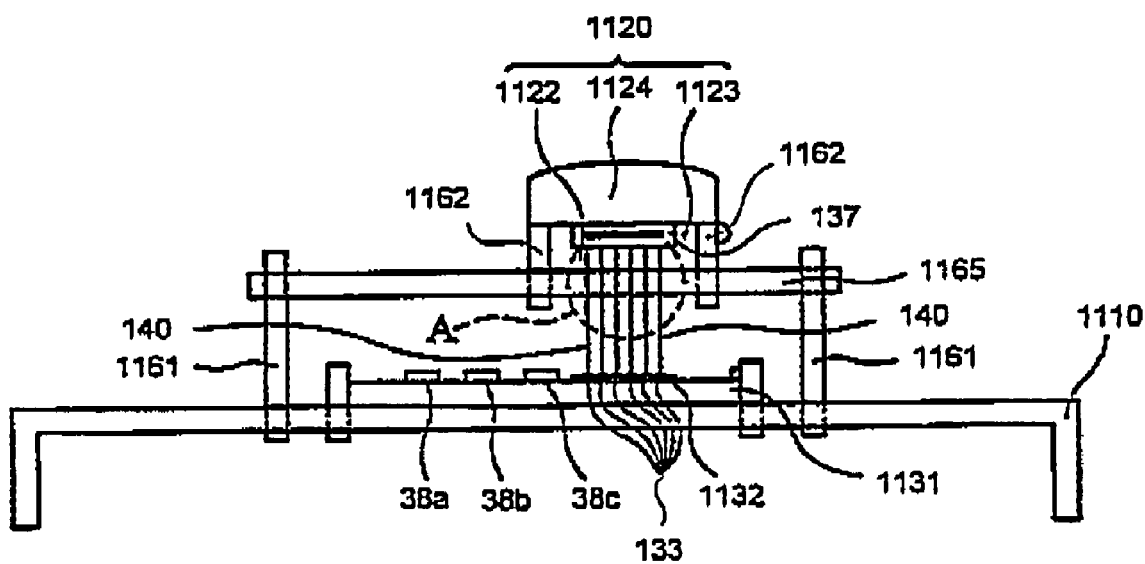
FIG. 12 is a diagram showing a side view of another apparatus of the present invention.

A further implementation of the present invention includes a stage for mechanically attaching the socket and the modified commercial electronic product. A stage may consist of a structure parallel to a circuit board of a modified commercial electronic product and provide mechanical support for a socket. In one implementation, a first plurality of support structures mechanically attaches the modified commercial electronic product to the stage. The first support structures may be directly attached to the modified commercial electronic product, or, the support structures may be attached to a mechanical housing to which the modified commercial electronic product is also attached in accordance with the above discussion. The socket may be directly attached to the stage. In another implementation, a second plurality of support structures mechanically attached the stage to the socket. In this implementation, the second plurality of support structures may suspend the socket above the stage, or, may secure the socket to the stage. Referring to FIG. 12, circuit board 1131 is attached to mechanical housing 1110 and contains electrical components 38a, 38b, 38c and electrical contacts 133. Stage 1165 is attached to the mechanical housing 1110 by first support structures 1161. Here, the first support structures 1161 have certain (or predetermined minimum) height, so as to lift or place the stage 1165 and the socket 1120 above other components (for example, electrical components 38a, 38b, 38c, etc.) to avoid the risk of damage thereto. In this example, second support structures 1162 do not suspend the socket 1120 above the stage, but rather, the socket 1120 rests on the stage 1165 and is secured by support structures 1162. While the first support structures 1161 as shown are not attached to the circuit board 1131, it is understood that the first support structures may attach to an interior or exterior area of the circuit board 1131, as described above. The socket includes a base 1122, seat 1123, an upper cap 1124, and terminal supports (not shown) and is configured to receive integrated circuit 137.

Figure 13:
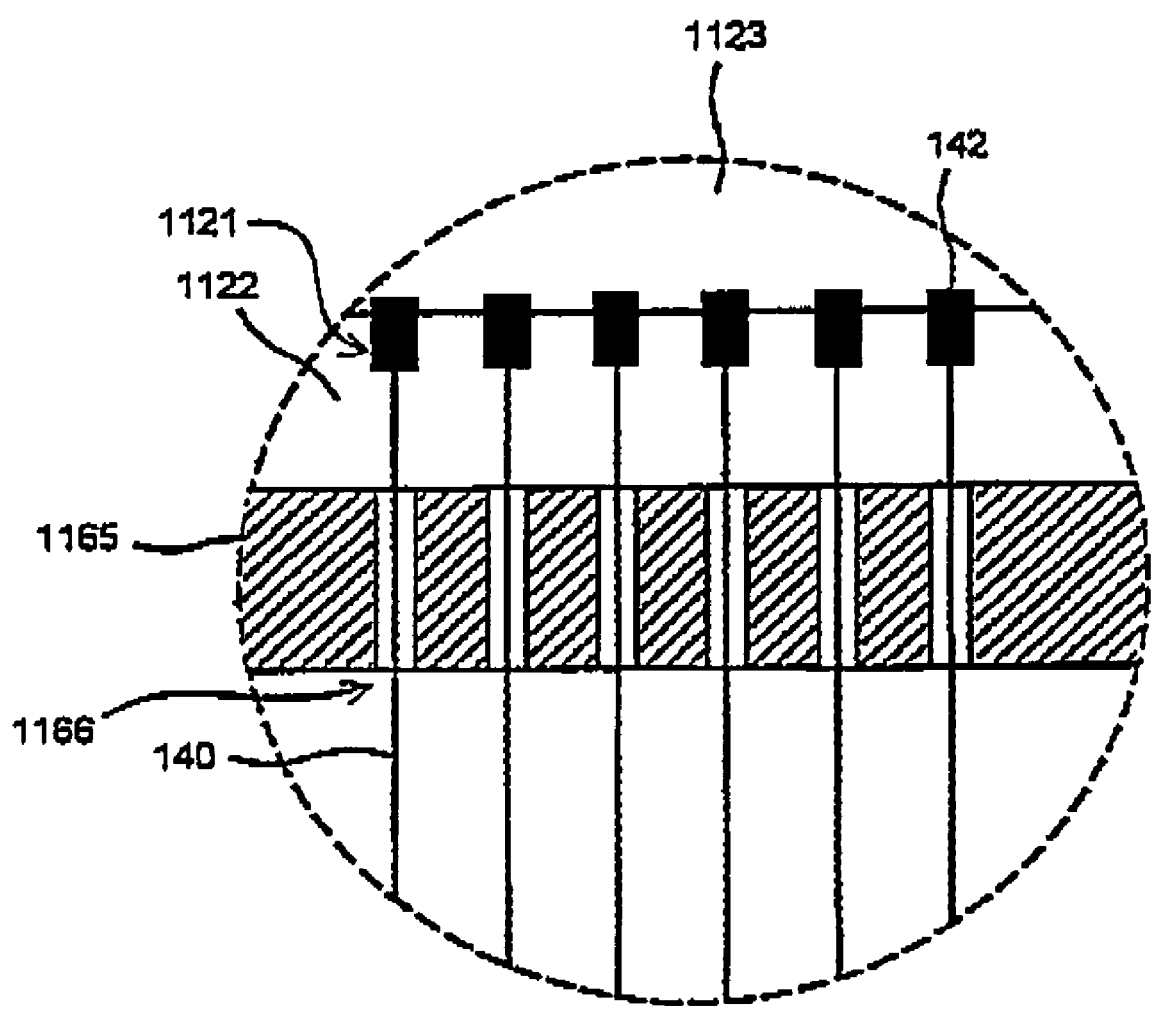
FIG. 13 is a diagram showing detail of Area A of FIG. 12.

The seat 1123 may also include mechanical support for terminals which electrical connect to one or more electrical contacts (not shown) of the integrated circuit 137. A plurality of conductors 140 electrically connects at least one (preferably, a plurality of) electrical contact of the integrated circuit 137 and at least one (preferably, a plurality of) electrical contact 133 of the circuit board 1131. The plurality of conductors 140 may attach to an adapter 1132 and terminals contained in the terminal supports (not shown). In one implementation, the stage contains at least one hole through which the plurality of conductors can pass without contacting the stage. FIG. 13 is an enlarged view of that shown by Area A in FIG. 12. The base 1122 of the socket sits on top of the stage 1165. A plurality of conductors may include terminals 142 which are contained in terminal supports 1121 positioned in the socket 1120 and are electrically connected to conductors 140. In one example, stage 1165 contains holes 1166 through which conductors 140 can pass without contacting the stage 1165. In another example, the stage may comprise one hole through which all conductors pass, or may contain any number of holes through which one or more conductors may pass. In another implementation, the stage may further include an electrical circuit. Such electrical circuit may include conductors for routing and may further include other electronic devices, such as connectors, switches, indicators, ports, and/or controllers. As such, the stage itself may comprise a circuit board including electrical conductors and components coupled to the socket 1120 (preferably, including the detection circuit) and/or conductors 140.

Figure 14:
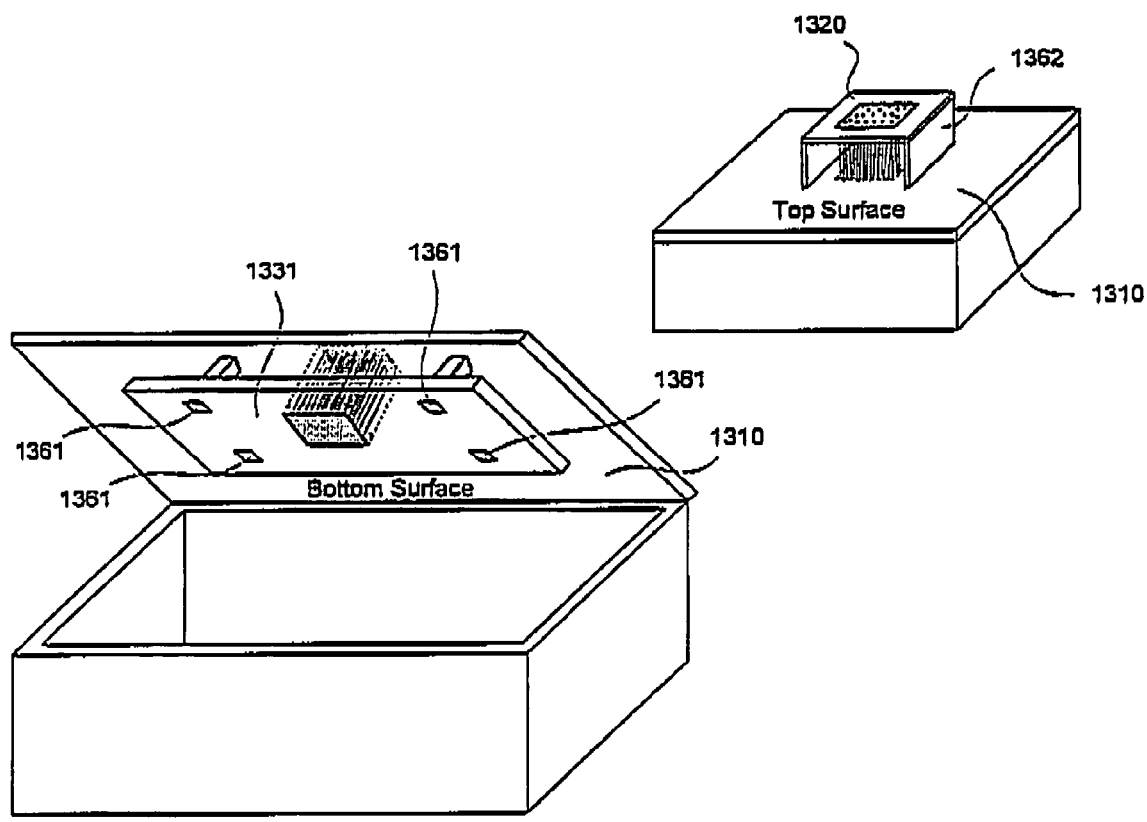
FIG. 14 is a diagram showing an other apparatus of the present invention.

In some applications, a commercial electronic product may be sensitive to Radio Frequency (RF) interference. Such commercial electronic products may include suppression devices such as conductive sheets or cages to reduce any unwanted RF signal. The testing apparatus of the present invention may require such shield to be removed or modified so that a plurality of conductors can electrically connect an integrated circuit and a modified commercial electronic product. FIG. 14 shows an exemplary apparatus which may be used in applications where RF interference is a consideration in testing an integrated circuit. Circuit board 1331 is placed in a conductive box or cage 1310 and therefore may be shielded from unwanted RF interference. In one example, a top portion of the box 1310 is parallel to the circuit board and for the purposes of this discussion, may be considered a stage, as described above. First support structures 1361 attach to circuit board 1331 and a bottom surface of stage/mechanical housing 1310. Second support structures 1362 attach to a socket 1320 and a top surface of a stage/mechanical housing 1310. While the circuit board 1331 of FIG. 14 is configured on the bottom surface of the stage 1310, it is understood that alternatively, the circuit board 1331 may be configured on a top surface of a stage 1310, and the socket 1320, and this integrated circuit, configured on the bottom surface of the stage 1310.

In another implementation, the apparatus for testing an integrated circuit include an input and/or output. Referring back to FIG. 3B, the optional component 13a may be an input and/or output port. Port 13a may electrically connect to the modified commercial electronic product 230, the socket

220b, port 11, switch 12, and/or indicator 13. In yet another implementation, a power source may be connected to the identified commercial electronic product. Power source 14 may be a DC-DC converter, an AC-DC converter, or may be a standalone power source such as a battery. In one example, power source 14 is the battery of the commercial electronic product. The power source 14 may further be connected to port 11 or port 13a.

Another Exemplary Apparatus for Testing an Integrated Circuit

In another embodiment, an exemplary apparatus for testing an integrated circuit can include: a power source; a switch; a tester comprising a socket configured to receive the integrated circuit, a circuit board substantially identical to that of a commercial electronic product configured to include the integrated circuit, a plurality of conductors electrically connecting at least one electrical contact of the integrated circuit and at least one electrical contact of the circuit board; and a circuit configured to detect (i) whether the integrated circuit is properly aligned in the socket and/or (ii) the voltage at and/or current through one or more predetermined terminals of the tester.

Figure 15:
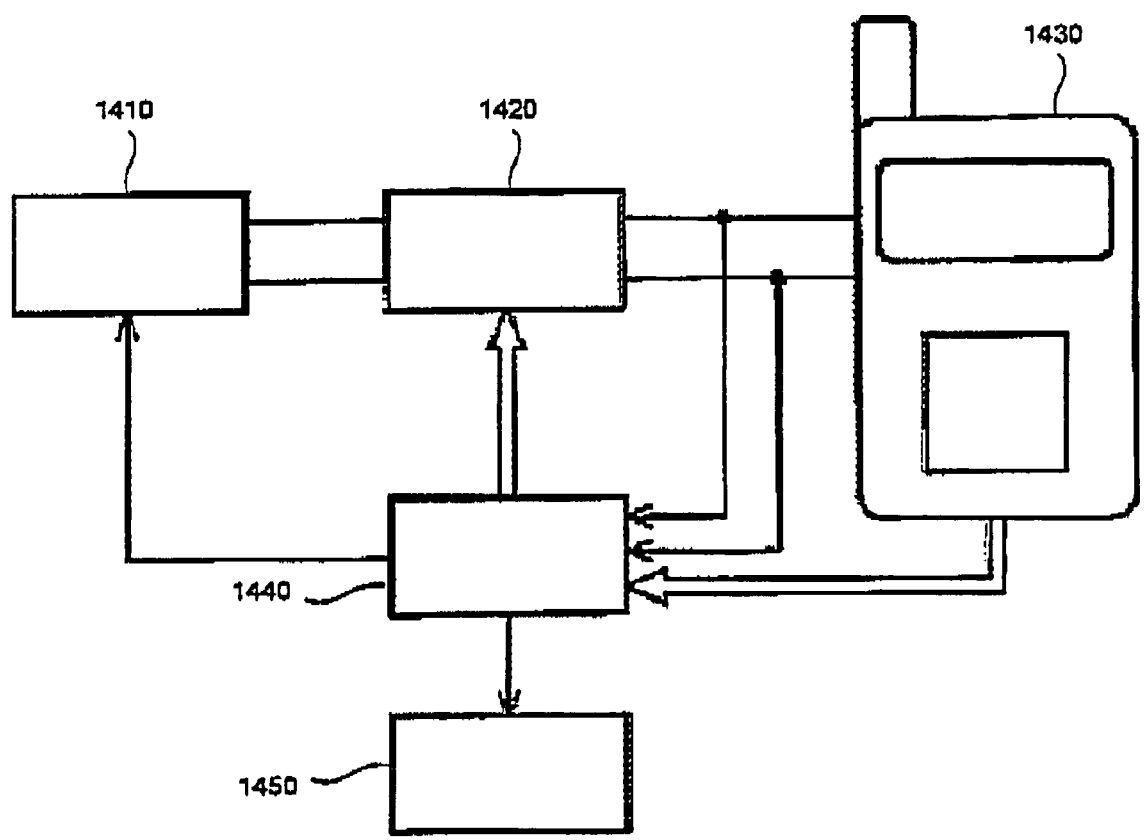
FIG. 15 is a diagram showing an exemplary apparatus for testing an integrated circuit according to the present invention.
Figure 16:
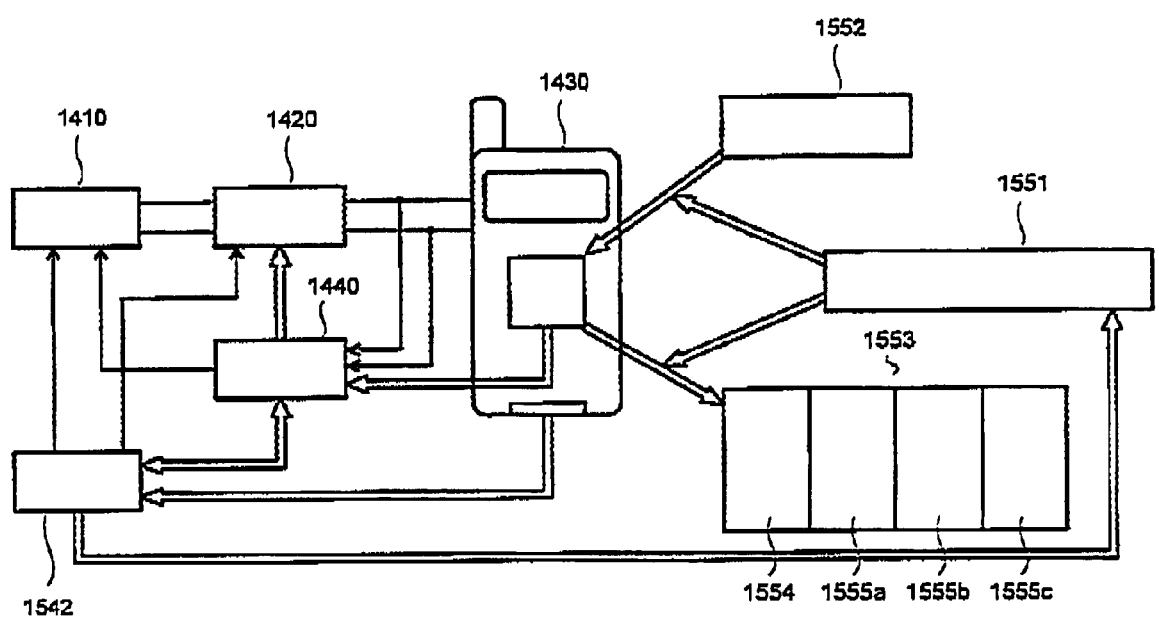
FIG. 16 is a diagram showing another exemplary apparatus for testing an integrated circuit according to the present invention.

As shown in FIG. 15, an apparatus for testing an integrated circuit may include a power supply 1410, a tester or switch 1420, a tester 1430 comprising a socket 1431, and a circuit 1440. In one example, an apparatus may include an indicator 1441 connected to the circuit 1440. In another example, and as shown in FIG. 16, the apparatus may include a control computer 1542, an automated chip loader 1551, a loading bin 1552, and an unloading bin 1553. The automated chip loader 1551 may include a top arm with two or more (preferably 3 or more) degrees of freedom and a holder (e.g., a vacuum wand) at and end of the arm for picking up, holding, and releasing an integrated circuit or chip, along with logic, indicators, and/or input and/or output ports. For example, the automated chip loader 1551 may be configured to pick up an integrated circuit from loading bin 1552, release it into a tester 1430 (e.g., place the IC into a socket), indicate that the integrated circuit is placed in the tester 1430 (e.g., by automatically closing a lid in test socket configured with a detector circuit as described herein), wait for an instruction from circuit 1440, pick up the tested integrated circuit from the tester 1430, and release the tested integrated circuit into an unloading bin 1553. The unloading bin 1553 may be partitioned such that an integrated circuit has passed is placed in bin 1554, and an integrated circuit that failed is placed in one of bins 1555a, 1555b, 1555c, depending on the fault mode of the integrated circuit. Alternatively, unloading bin 1553 may be predetermined such that a failed integrated circuit is placed in bin 1554, and "passing"0 integrated circuits are placed in one of bins 1555a, 1555b, 1555c, depending on the test criteria and/or results e.g., the hold parameter value[s]) for the particular bin.

Figure 17:
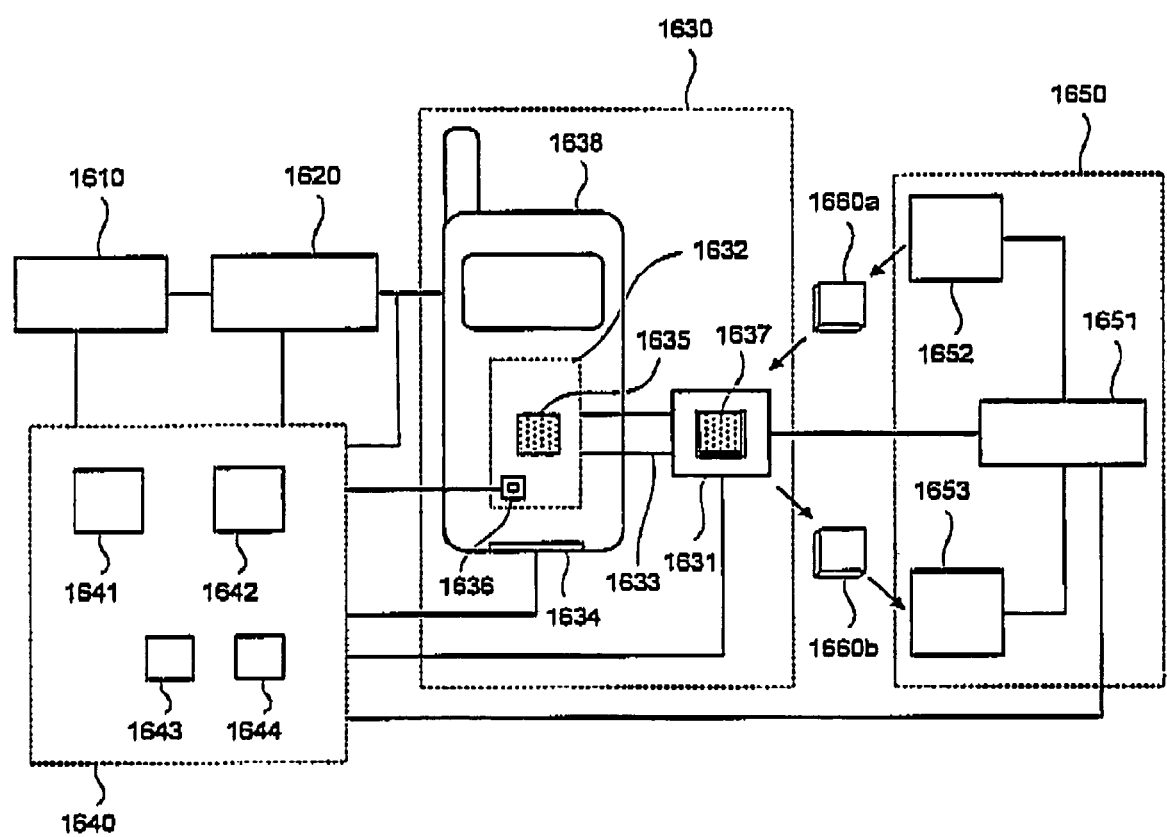
FIG. 17 is a diagram showing yet another exemplary apparatus for testing an integrated circuit according to the present invention.

In greater detail, and referring now to FIG. 17, an apparatus for testing an integrated circuit can include a power source 1610, a switch 1620, a tester 1630, and a circuit 1640. The power source 1610 may be a DC-DC converter, an AC-DC converter, a battery, or any other source. In one example, switch 1620 may be configured open to prevent power from conducting from the power source 1610 to the tester 1630. In another example, switch 1620 may be configured to short the output of the power source 1610 to ground. While the exemplary switch is an element separate from that of either the tester 1630 or the power source 1610, it is understood that switch 1620 may be a component of the power source, the tester, and/or any other device in the testing apparatus. The switch may be a physical switch or any other functional switch and the present invention is intended to include the function of a switch: to prevent power from conducting to the socket 1631, circuit board 1632, tester 1630, and/or the entire testing apparatus. Tester 1630 may also include a plurality of conductors 1633 configured to electrically connect at least one electrical contact of integrated circuit 1660 and at least one electrical contact 1635 of circuit board 1632. Conductive terminals within terminal supports 1637 may be one or more of the plurality of conductors 1633. The tester may further include an input/output port 1634 for connecting to circuit 1640.

Circuit 1640 may comprise several detectors. In one example, circuit 1640 receives an indicator from socket 1631 which may contain additional circuitry necessary to detect whether the integrated circuit 1660 is properly aligned. In another example, circuit 1640 may include a voltage detector comprising a voltage reference and a comparator, configured to detect when the detected voltage at a predetermined terminal of the tester 1630 is greater or less than a reference voltage. Or, the circuit may comprise a plurality of voltage detectors, configured to detect when the detected voltage at a predetermined terminal of the tester 1630 is inside or outside a predetermined voltage range. In another example, the circuit 1640 may include a current detector to detect the current flowing through a predetermined terminal of the tester 1630. This may include, and while not shown, a current detector placed in series with the predetermined terminal of the tester 1630. The current detector may also contain other elements, such as comparators, configured to indicate when the current is greater or less than a reference current or inside or outside a predetermined current range.

The power source 1610 may be coupled to the tester 1630 by switch 1620. In one implementation, the circuit 1640 may be configured to open switch 1620 if (i) the integrated circuit 1660 is not properly aligned in the socket 1631 and/or (ii) the voltage at and/or current through one or more predetermined terminal of the tester 1630 is outside of a predetermined range of values. In another implementation, the testing apparatus may include an indicator 1641 configured to indicate (i) whether the integrated circuit 1660 is properly aligned in the socket 1631 and/or (ii) the voltage at and/or current through one or more predetermined terminals of the tester 1630. In one example, a visual indicator may include one or more LCD screens, LEDs, and/or analog displays (e.g., a voltmeter or galvanometer). In another example the indicator may be an audio signal generated from a buzzer or speaker. In yet another example, the indicator may be an electrical signal in a circuit.

The apparatus for testing an integrated circuit may further include analog and/or digital logic. While logic 1642 is shown as an element of circuit 1640, it is understood that logic 1642 may be a component, such as a controller or computer, which is connected to circuit 1640. For example, logic 1642 may be a microcontroller which is part of circuit 1640 or may be a personal computer (PC) which is connected to circuit 1640. In one implementation, logic 1642 may be configured to open switch 1620 if (i) the integrated circuit is not properly aligned in the seat and/or (ii) the voltage at and/or current through one or more predetermined terminals of the tester from the power source is outside of a predetermined range of values. In one example, circuit 1640 is configured to receive an indicator from voltage or current detectors and/or detectors for detecting whether the integrated circuit is properly aligned in the seat. The circuit 1640 is further configured to control the switch 1620 corresponding to the indicators. For example, if the integrated circuit 1660 is not properly placed in the socket 1631, or the voltage or current at a predetermined terminal of the tester 1630 is outside of a predetermined range, the circuit 1640 is configured to open switch 1620 to prevent electricity from following through the tester 1630.

In another implementation, the logic is also connected to the tester through an input and/or output port and configured to control the tester corresponding to a program. As stated above, the tester 1630 may include an input/output port 1634. Further, circuit board 1632 may include an input/output port 1636. Logic 1642 may connect to the tester 1630 through input/output port 1634 and/or port 1636. Logic 1642 may include a program containing instruction for controlling the tester 1630. One example may include an instruction to "power up" the tester. Another example may include an instruction which configures the tester to turn on various peripheral devices. In yet another example, logic 1642 may cause a test waveform to be propagated through the tester 1630 and compare the actual response of the tester 1630 to the expected response. Such a waveform may be sent to or received by an input/output port 1634 or 1636 or to predetermined terminal of the tester (preferably, a power terminal). The waveform may also be an electromagnetic and/to optical signal transmitted to a peripheral component such as an antenna, light sensor or receiver, and/or an image sensor. The program may include numerous instructions each of which is configured to exercise a particular function of the tester.

In a further implementation, the apparatus for testing an integrated circuit includes a memory element 1643 configured to record one or more results of the program. Such memory element may be included in or connected to logic 1642. Another implementation includes an indicator 1644 configured to indicate one or more results of the program. The indicator may be visual such as by using an LCD, LED, and/or other analog display or may be audible such as by using a buzzer or speaker. The indicator may also be an electrical signal in a circuit. The indicator 1644 which is configured to indicate the results of the program may be combined with the indicator 1641 which is configured to indicate whether the integrated circuit is properly placed in the socket and/or the voltage at and/or current through one or more predetermined terminals of the tester. Indicator 1641 and/or indicator 1644 may further indicate a result of a comparison between the actual voltage at and/or current through one or more predetermined terminals of the tester and the expected voltage and/or current.

In one implementation, the apparatus for testing an integrated circuit includes an automated chip loader 1650 which is couple to circuit 1640 and configured to load and unload the integrated circuit corresponding to the program within logic 1642. The automated chip loader 1650 includes a mechanical device 1651 for moving integrated circuits in and out of socket 1631. In FIG. 17, the mechanical device 1651 is configured to remove integrated circuit 1660a from a loading bin 1652 and place it in socket 1631. Integrated circuit 1660a is a circuit to be tested and integrated circuit 1660b is a circuit that has already been tested. After the integrated circuit has been tested, the mechanical device 1651 is configured to remove integrated circuit 1660b from the socket 1631 and place it in an unload bin 1653. In one example, the mechanical device 1651 can further mark the integrated circuits with various inks or dyes corresponding to the results of the program. In another example, the mechanical device of 1651 can sort the integrated circuits into one or more parts (such as bin 1654 or 1655a, 1655b, 1655c) of the unloading bin 1653 corresponding to the results of the program. Further, the automated chip loader 1650 may be configured to record (i) the results of the program corresponding to an integrated circuit and (ii) the location of the integrated circuit.

An Exemplary Method of Testing an Integrated Circuit

In another embodiment, an exemplary method of testing an integrated circuit can include: placing the integrated circuit in a socket which is mechanically coupled to a modified commercial electronic product, the modified commercial electronic product comprising a circuit board substantially identical to that of a commercial electronic product configured to include the integrated circuit, but which does not include the integrated circuit; and testing the integrated circuit.

FIG. 17 shows an exemplary apparatus for testing an integrated circuit including a socket 1631 which is coupled to a modified commercial electronic product 1638. In one aspect of the invention, a method of testing an integrated circuit comprises placing the integrated circuit in a socket. The modified commercial electronic product includes a circuit board substantially identical to a commercial electronic product. While the circuit board is configured to include an integrated circuit, the circuit board of the modified commercial electronic product does not include the integrated circuit. Rather, the integrated circuit is placed in the socket.

In one implementation, the method may further include connecting the modified commercial electronic product to a power source. The power source may be a DC-DC converter, an AC-DC converter, or may be a stand alone power source such as a battery. The modified commercial electronic product may be directly connected to the power source, or may be indirectly connected to the power source, such as connected through fuses, switches, or other conductors, elements, or circuitry.

In another implementation, the method may include indicting the voltage at and/or current through one or more predetermined terminals of the modified commercial electronic product. The predetermined terminals of the modified commercial electronic product may be physically located on the modified commercial electronic product, or, the predetermined terminals may be electrically connected to the modified commercial electronic product. For example, the voltage and/or current may be measured on a conductor not physically on the modified commercial electronic product, such as on the output terminals of the power source, or on a part of a conductor electrically connecting the power source and the modified commercial electronic product. The voltage and/or current may be indicated visually by using an LCD display, LEDs, analog displays, audibly by a buzzer or speaker, and/or electrically by an electric signal in a circuit, or any combination of the above.

In yet another implementation, the method may include detecting whether the integrated circuit is properly placed in the socket. On example of detecting whether the integrated is properly placed in the socket includes configuring (i) the socket to include tow or more conductive terminals and a conductor, and (ii) a circuit to detect whether the conductive terminals electrically contact the conductor. Another example may include placing one or more electro-mechanical switches on a first portion of a socket and configuring a second portion of a socket to mechanically push the switch when the integrated circuit is properly placed in the circuit. Another implementation may include the method of indicating whether the integrated circuit is properly placed in the socket. The indication may be made visually by using an LCD display, LEDs, analog displays, audibly by a buzzer or speaker, and/or electrically by an electric signal in a circuit, or any combination of the above.

In another implementation, the method can include electrically disconnecting the modified commercial electronic product from the power source when (i) the integrated circuit is not properly placed in the socket and/or (ii) the voltage at and/or current through one or more predetermined terminals of the modified commercial electronic product is outside of a predetermined range of values. In one example, the modified commercial electronic product may be disconnected from the power source by operating a switch in series with the modified commercial electronic product and the power source. In another example, the output of the power source may be shorted to ground.

Another implementation of the invention includes selecting a program controlled by a processor and/or external computer. The program may be stored in the processor and/or external computer or the program may be stored in storage elements connected thereof. The program may include instructions configured to control the modified commercial electronic product to perform a predefined function. Further, the program may further compare expected results from executing the instructions to the actual results. The processor and/or external computer may also store the results in a memory element contained in the processor and/or external computer, or may store the results in an external memory element.

In another implementation, the method may include automatically loading and unloading the integrated circuit into and/or out of the socket. On example can include connecting an automated chip loader to the processor and/or external computer which runs a program, and placing integrated circuits into, and removing them from, the socket corresponding to the program. The design and implementation of such automated equipment configured to carry out such a method is within the level of skill in the applicable art(s), as described herein. For example, the processor and/or external computer may be programmed to: (1) load a first integrated circuit in a socket; (2) detect whether the integrated circuit is properly placed in the socket; (3) close a switch so as to apply power to the modified commercial electronic product; (4) instruct the modified commercial electronic product to perform one/or more predetermined functions; (5) compare, record, and/or indicate the results of such program; (6) open the switch so as to remove power from the modified commercial electronic product; (7) unload the integrated chip, and place it in a bin; (8) and record the results of the program corresponding to the integrated circuit and its location in the bin and/or mark the integrated circuit with ink. The processor and/or external computer may further be programmed to: load another integrated circuit in a socket; repeat steps (2)-(8) as above; and, repeat until the last integrated circuit to be tested is unloaded from the socket.

In yet another implementation, the method may include indicating one or more results of the program. The indication may be made visually by using an LCD display, LEDs, analog displays, audibly by a buzzer or speaker, electrically by an electric signal in a circuit, and/or any combination of the above.

An Exemplary Method of Making an Integrated Circuit Tester

In another embodiment, an exemplary method of making an integrated circuit tester can include: mechanically attaching a socket to a modified commercial electronic product, the modified commercial electronic product comprising a circuit board substantially identical to that of a commercial electronic product configured to include the integrated circuit, but which does not include the integrated circuit; and configuring a plurality of conductors to electrically connect at least one electrical contact of the integrated circuit and at least one electrical contact of the modified commercial electronic product when the integrated circuit is in the socket.

In one implementation, the method of mechanically attaching the socket to the modified commercial electronic product can include connecting one or more support structures to the modified commercial electronic product in a passive/and or non-conductive area. A passive and or non-conductive area is one in which there are no electrically conductive components in or near which would interfere with the normal operation of the integrated circuit or the modified commercial electronic product in general.

In a further implementation, the method may further include modifying the commercial electronic product such that one or more of the support structures mechanically attach to the modified commercial electronic product in a passive and/or non-conductive area. For example, a circuit board in the commercial electronic product may be modified to move traces, conductive lines, busses, vias or otherwise and relocate electrical contacts to accommodated for attaching such support structures. In another example, traces, conductive lines, busses, vias or otherwise may be pulled back from an edge of the PCB to accommodate thru-holes for which to place one or more support structures.

In another implementation, the method can include modifying the commercial electronic product such that one or more electrical contacts of the modified commercial electronic product electrically connected one or more electrical contacts of the integrated circuit. It may be necessary to move one or more electrical contacts to provide for mechanically attaching a plurality of conductors. For example, it may be necessary to relocate one or more electrical contacts on one side of a circuit board to another side of a circuit board that a plurality of conductors may be attached thereto.

To the extent that modifying a commercial electronic product is necessary to mechanically attach support structures or to electrically connect the modified commercial electronic product to the integrated circuit, it is preferred that the relocation is minimized so that a maximum portion of the modified commercial electronic product is the same as the unmodified commercial electronic product.

In one example, a commercial electronic product can be modified in one or more of the following ways: it may be configured for, but not include, an integrated circuit to be tested; a socket may be physically and/or electrically attached to the modified commercial electronic product; traces on the commercial electronic product may be relocated to allow attachment of the socket and/or support structures for stage and/or a socket; and the commercial electronic product and/or the socket may be configured for an automated chip loader to place one or more integrated circuits into the socket.

CONCLUSION/SUMMARY

Thus, the present invention provides apparatuses and methods for testing an integrated circuit.

The foregoing description of specific embodiments of the present invention have been presented from purposes of illustration and description. They are not intended to be exhaustive to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An apparatus for testing an integrated circuit, comprising:
   a) a socket comprising a plurality of electrical conductors electrically connected to a first circuit board, a seat configured to hold and align said integrated circuit, a base comprising a mechanical support for said seat, and an upper cap configured to expose said seat and secure said integrated circuit in said seat, wherein said socket is configured to receive said integrated circuit and electrically connect at least one electrical contact of said integrated circuit and at least one of said plurality of electrical conductors;
   b) a modified commercial electronic product comprising said first circuit board, wherein said first circuit board is substantially identical to a second circuit board from an unmodified commercial electronic product that includes said integrated circuit, and said first circuit board in said modified commercial electronic product does not include said integrated circuit;
   c) a stage for mechanically attaching said socket and said modified commercial electronic product; and
   d) a circuit configured to detect whether said integrated circuit is properly aligned in said seat.

2. The apparatus of claim 1, wherein said modified commercial electronic product further comprises substantially all electrical, mechanical, and/or electro-mechanical components present in said unmodified commercial electronic product such that, when coupled to said integrated circuit, said modified commercial electronic product performs a predefined function of said unmodified commercial electronic product substantially identically to said unmodified commercial electronic product.

3. The apparatus of claim 1, further comprising a mechanical housing containing said first circuit board.

4. The apparatus of claim 1, wherein said socket is further configured to support a terminal of each of said plurality of conductors, each terminal contacting one of said electrical contact(s) of said integrated circuit.

5. The apparatus of claim 1, wherein said base comprises a mechanical support for more than one seat.

6. The apparatus of claim 1, further comprising an indicator configured to indicate whether said integrated circuit is properly aligned in said seat.

7. The apparatus of claim 1, further comprising support structures for mechanically attaching said socket and said modified commercial electronic product.

8. The apparatus of claim 1, further comprising a first plurality of support structures for mechanically attaching said modified commercial electronic product and said stage.

9. The apparatus of claim 1, further comprising a second plurality of support structures for mechanically attaching said socket and said stage.

10. The apparatus of claim 1, wherein said stage comprises at least one void through which said plurality of conductors can pass without contacting said stage.

11. The apparatus of claim 1, wherein said stage comprises an electrical circuit coupled to said socket.

12. The apparatus of claim 1, wherein said modified commercial electronic product further comprises an input and/or output port.

13. The apparatus of claim 1, further comprising a power source connected to said modified commercial electronic product.

14. The apparatus of claim 13, further comprising a switch configured to electrically connect said power source to said modified commercial electronic product and/or disconnect said power source from said modified commercial electronic product.

15. The apparatus of claim 1, further comprising a circuit configured to detect (i) whether said integrated circuit is properly aligned in said socket and/or (ii) a voltage at and/or a current through one or more of said electrical contacts of said modified commercial electronic product.

16. The apparatus of claim 1, further comprising a test program configured to control said apparatus and/or to test said integrated circuit.

17. The apparatus of claim 16, further comprising an indicator configured to indicate one or more results of testing said integrated circuit.

18. The apparatus of claim 16, further comprising a memory element configured to record one or more results of testing said integrated circuit.

19. The apparatus of claim 16, further comprising an automated chip loader, coupled to said circuit, configured to load and unload said integrated circuit.

20. The apparatus of claim 19, wherein said automated chip loader loads and unloads said integrated circuit in response to an instruction from said test program.

21. The apparatus of claim 1, further comprising a test program controlled by a processor and/or external computer, said test program comprising instructions configured to control said testing apparatus.

22. The apparatus of claim 21, further comprising an automated chip loader configured to load and unload said integrated circuit into or out of said socket.

23. The apparatus of claim 22, wherein said automated chip loader loads and unloads said integrated circuit in response to an instruction from said program.

24. An apparatus for testing an integrated circuit, comprising:
   a) a socket comprising a plurality of electrical conductors electrically connected to a first circuit board, a seat configured to hold and align said integrated circuit, a base comprising a mechanical support for said seat, and an upper cap configured to expose said seat and secure said integrated circuit in said seat, wherein said socket is configured to receive said integrated circuit and electrically connect at least one electrical contact of said integrated circuit and at least one of said plurality of electrical conductors;
   b) a modified commercial electronic product comprising said first circuit board, wherein said first circuit board is substantially identical to a second circuit board from an unmodified commercial electronic product that includes said integrated circuit, and said first circuit board in said modified commercial electronic product does not include said integrated circuit; and
   c) a circuit configured to detect whether said integrated circuit is properly aligned in said seat.

25. The apparatus of claim 24, wherein said modified commercial electronic product further comprises substantially all electrical, mechanical, and/or electro-mechanical components present in said unmodified commercial electronic product such that, when coupled to said integrated circuit, said modified commercial electronic product performs a predefined function of said unmodified commercial electronic product substantially identically to said unmodified commercial electronic product.

26. An apparatus for testing an integrated circuit, comprising:
   a) a socket comprising a plurality of electrical conductors electrically connected to a first circuit board, wherein said socket is configured to receive said integrated circuit and electrically connect at least one electrical contact of said integrated circuit and at least one of said plurality of electrical conductors;

b) a modified commercial electronic product comprising said first circuit board, wherein said first circuit board is substantially identical to a second circuit board from an unmodified commercial electronic product that includes said integrated circuit, and said first circuit board in said modified commercial electronic product does not include said integrated circuit; and c) a circuit configured to detect (i) whether said integrated circuit is properly aligned in said socket and/or (ii) a voltage at and/or a current through one or more of said electrical contacts of said modified commercial electronic product.

27. The apparatus of claim 26, further comprising a power source connected to said modified commercial electronic product.

28. The apparatus of claim 26, further comprising a switch configured to conduct electricity when the integrated circuit is properly aligned in the socket.

29. The apparatus of claim 28, wherein said circuit is further configured to open said switch if (i) said integrated circuit is not properly aligned in said socket and/or (ii) the voltage at and/or the current through said one or more of said electrical contacts is outside a predetermined range of values.

30. The apparatus of claim 28, further comprising logic configured to open said switch if said integrated circuit is not properly aligned in said socket and/or if the voltage at and/or the current through said one or more of said electrical contacts is outside a predetermined range of values.

31. The apparatus of claim 30, wherein said logic opens said switch when the voltage at and/or the current through said one or more of said electrical contacts is outside the predetermined range of values, and said logic is coupled to said one or more electrical contacts of said modified commercial electronic product through one or more input ports and/or one or more output ports.

32. The apparatus of claim 26, further comprising an indicator configured to indicate (i) whether said integrated circuit is properly aligned in said socket and/or (ii) the voltage at and/or the current through said one or more of said electrical contacts.

33. The apparatus of claim 26, wherein said modified commercial electronic product further comprises substantially all electrical, mechanical, and/or electro-mechanical components present in said unmodified commercial electronic product such that, when coupled to said integrated circuit, said modified commercial electronic product performs a predefined function of said unmodified commercial electronic product substantially identically to said unmodified commercial electronic product.

34. The apparatus of claim 26, further comprising an indicator configured to indicate whether said integrated circuit is properly aligned in said seat.

35. The apparatus of claim 26, further comprising a test program controlled by a processor and/or external computer, said test program comprising instructions configured to control said testing apparatus.

* * * * *